US008755590B2

(12) United States Patent
Sandstrom et al.

(10) Patent No.: US 8,755,590 B2
(45) Date of Patent: Jun. 17, 2014

(54) METHOD AND DEVICE USING ROTATING PRINTING ARM TO PROJECT OR VIEW IMAGE ACROSS A WORKPIECE

(71) Applicant: Micronic Mydata AB, Taby (SE)

(72) Inventors: Torbjorn Sandstrom, Pixbo (SE); Sten Lindau, Taby (SE)

(73) Assignee: Micronic Laser Systems AB, Taby (SE)

( * ) Notice: Subject to any disclaimer, the term of this patent is extended or adjusted under 35 U.S.C. 154(b) by 0 days.

(21) Appl. No.: 13/893,294

(22) Filed: May 13, 2013

(65) Prior Publication Data
US 2013/0250030 A1 Sep. 26, 2013

Related U.S. Application Data

(63) Continuation of application No. 12/631,653, filed on Dec. 4, 2009, now Pat. No. 8,442,302.

(60) Provisional application No. 61/200,970, filed on Dec. 5, 2008.

(51) Int. Cl.
G06K 9/00 (2006.01)
(52) U.S. Cl.
USPC ............................. 382/153; 382/295; 382/298
(58) Field of Classification Search
USPC .................................. 382/152, 153, 294, 295
See application file for complete search history.

(56) References Cited

U.S. PATENT DOCUMENTS 7,084,411 B2 * 8/2006 Lammer-Pachlinger
 et al. .......................... 250/492.1
2005/0087701 A1 4/2005 Lammer-Pachlinger et al.
2007/0188591 A1 8/2007 Sandstrom

OTHER PUBLICATIONS

English Translation of First Office Action and Search Report of corresponding Chinese Patent Application No. 200980156015.4, Apr. 19, 2013, pp. 1-7.
First Office Action and Search Report of corresponding Chinese Patent Application No. 200980156015.4, Apr. 19, 2013, pp. 1-6.
International Search Report of corresponding PCT Application No. PCT/EP2009/066414, mailed Oct. 3, 2010, pp. 1-3.
International Preliminary Report on Patentability of corresponding PCT Application No. PCT/EP2009/066414, mailed Apr. 13, 2011, pp. 1-13.
Written Opinion of corresponding PCT Application No. PCT/EP2009/066414, dated May 6, 2011, pp. 1-5.

* cited by examiner

Primary Examiner — Roy M Punnoose
(74) Attorney, Agent, or Firm — Haynes Beffel & Wolfeld LLP; Christopher Blizzard

(57) ABSTRACT

The technology disclosed relates to scanning of large flat substrates for reading and writing images. Examples are flat panel displays, PCB's and photovoltaic panels. Reading and writing is to be understood in a broad sense: reading may mean microscopy, inspection, metrology, spectroscopy, interferometry, scatterometry, etc. of a large workpiece, and writing may mean exposing a photoresist, annealing by optical heating, ablating, or creating any other change to the surface by an optical beam. In particular, we disclose a technology that uses a rotating or swinging arm that describes an arc across a workpiece as it scans, instead of following a traditional straight-line motion.

27 Claims, 16 Drawing Sheets

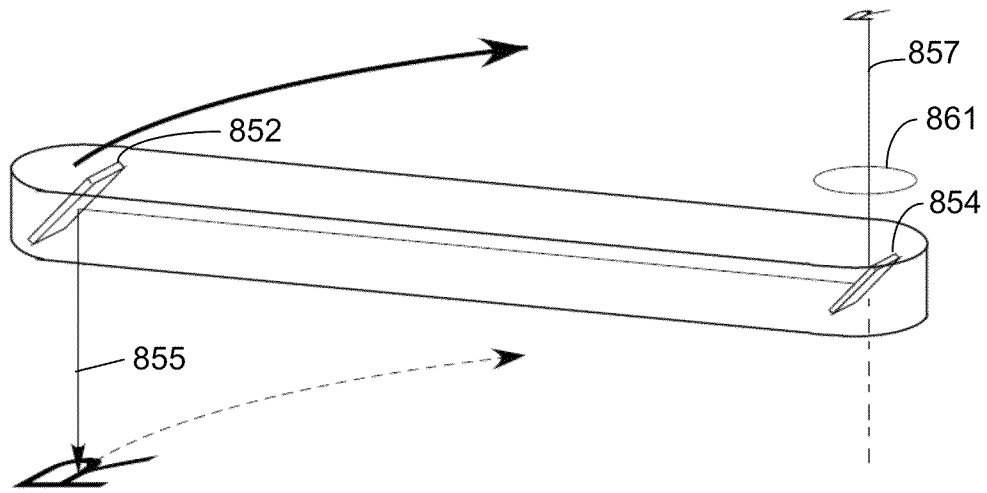
Figure 8a - Image before
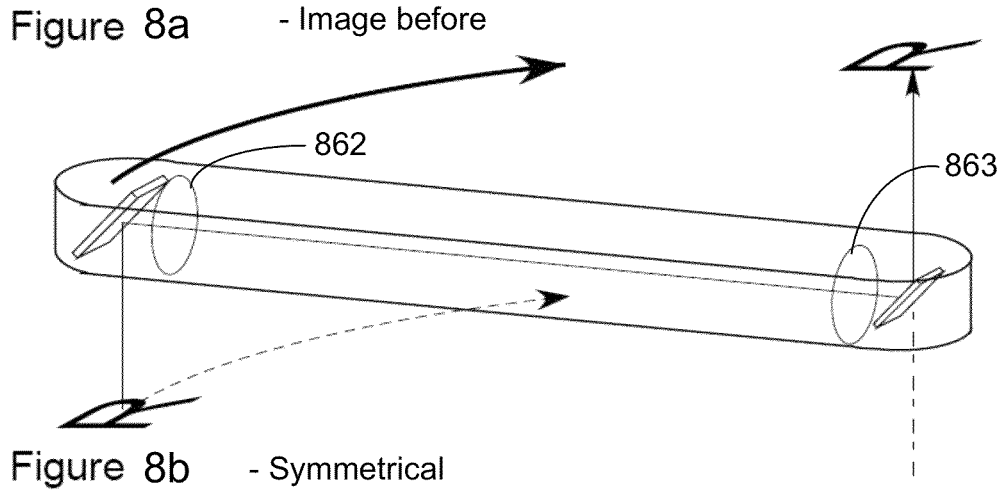
Figure 8b - Symmetrical
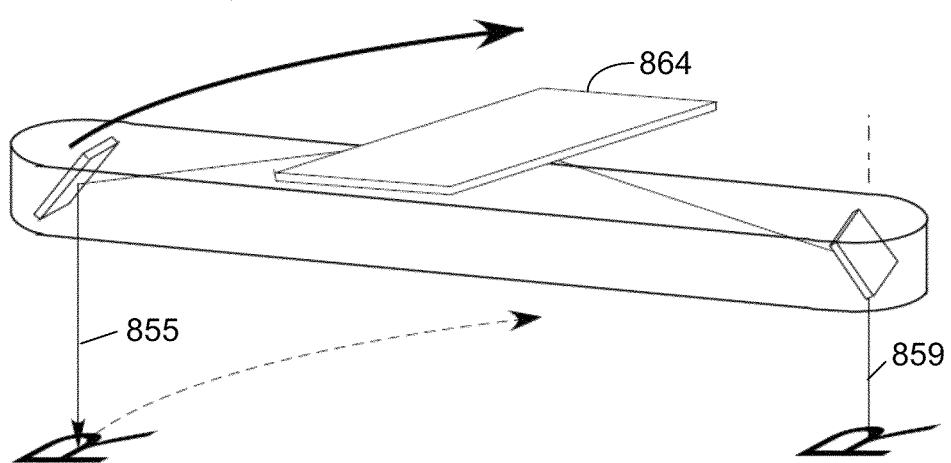
Figure 8c - Anti-parallel

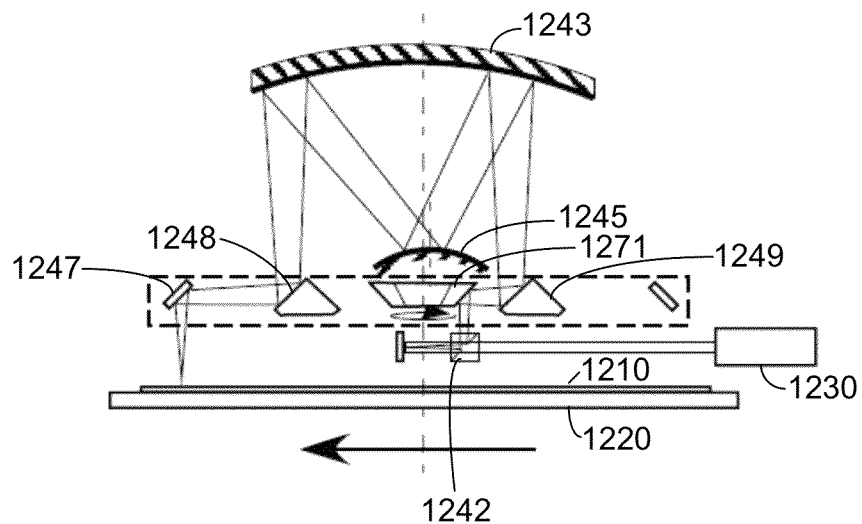
Figure 12a — Side view of a relay
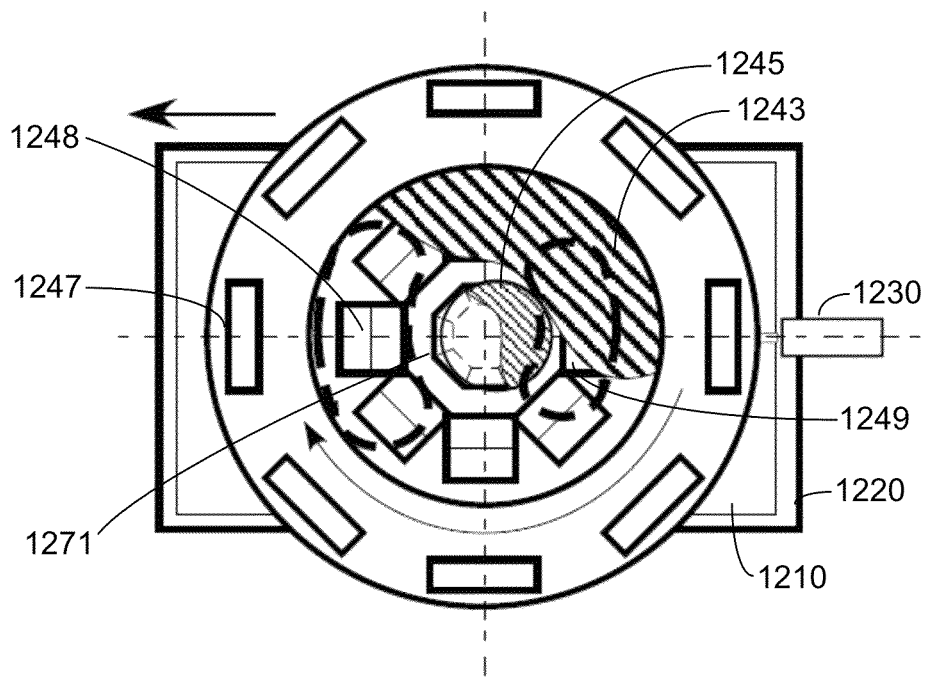
Figure 12b — Top view, eight arms Rotating mirror on axis
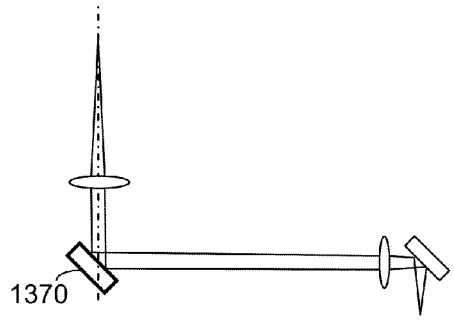
1370
Rotating pyramid mirror off axis
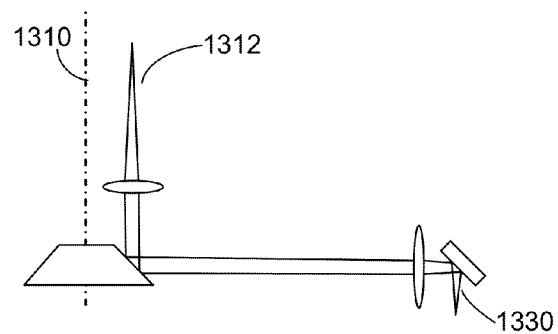
1310   1312
1330
Top view, 0 degree rotation
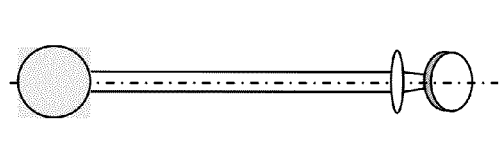
Top view, 0 degree rotation
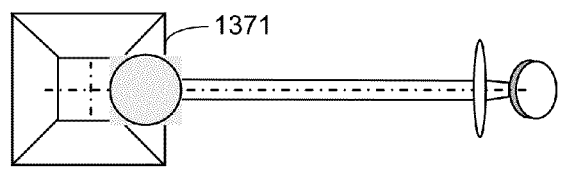
1371
Top view, arm rotated
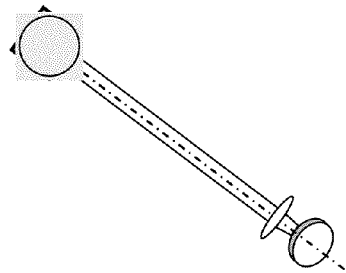
Top view, arm rotated
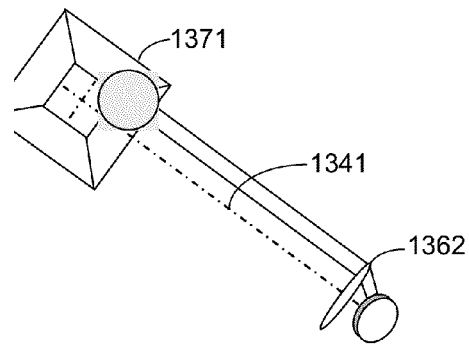
1371
1341
1362
Figure 13a
Figure 13b Rotating pyramid mirror and tilted incidence
Pyramid facet angle adapted to yield reflected beam perpendicular to rotation axis
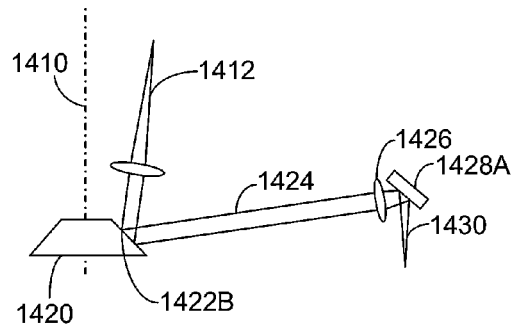
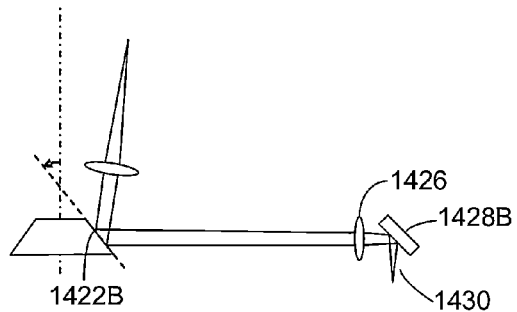
Top view, 0 degree rotation
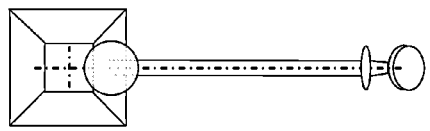
Top view, 0 degree rotation
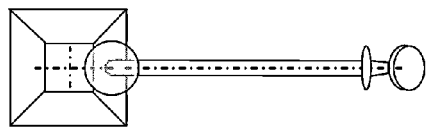
Top view, arm rotated
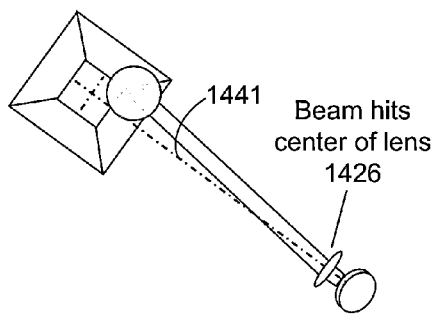
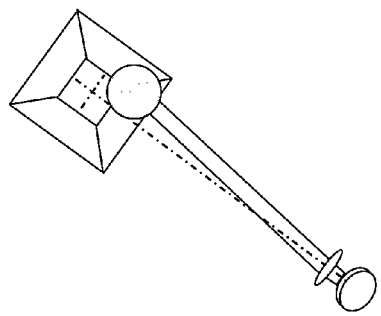
Figure 14a
Figure 14b Tube lens after pyramid mirror
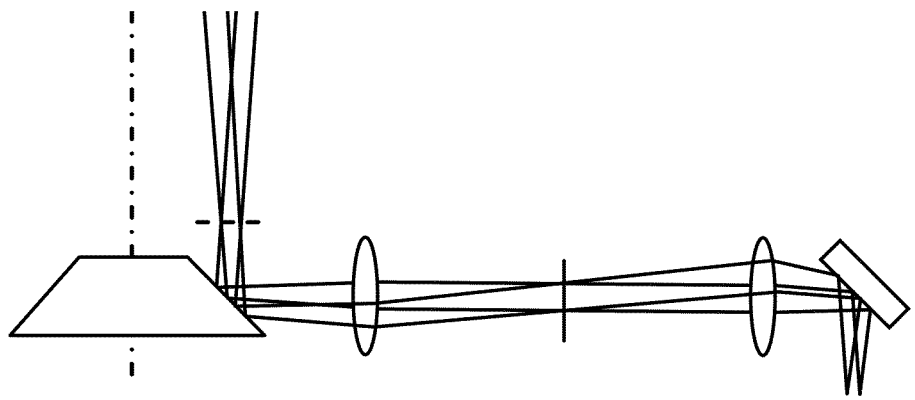
Top view, 0 degree rotation
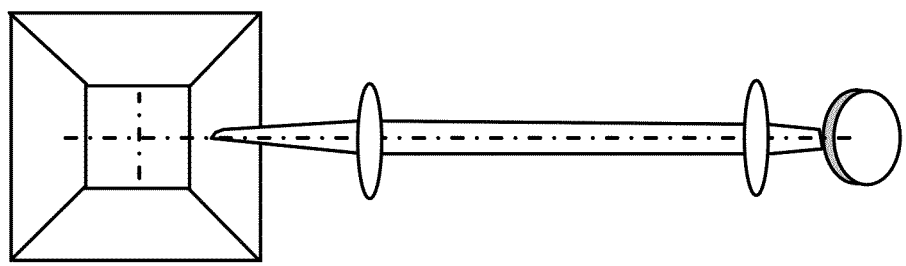
Top view, arm rotated
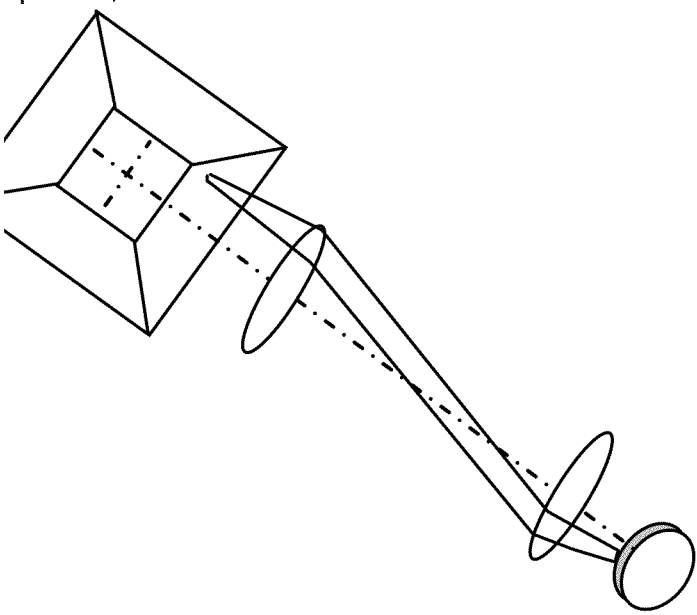
Figure 15

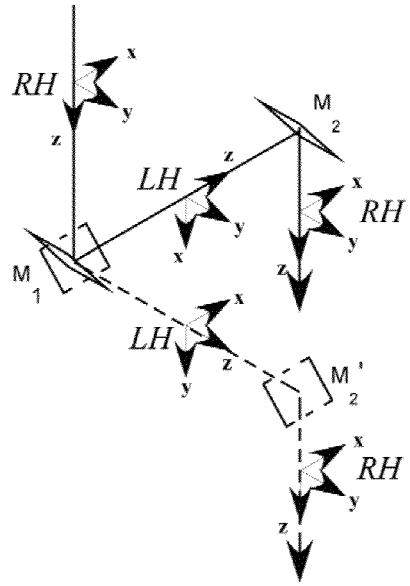
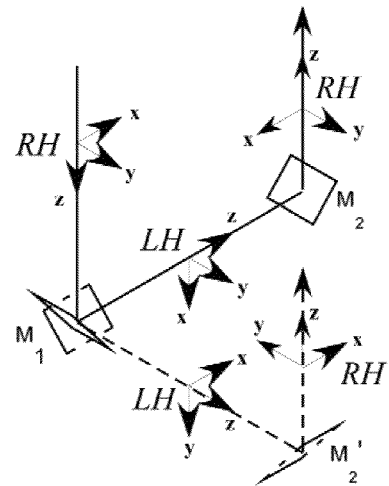
Figure 16a
Figure 16b
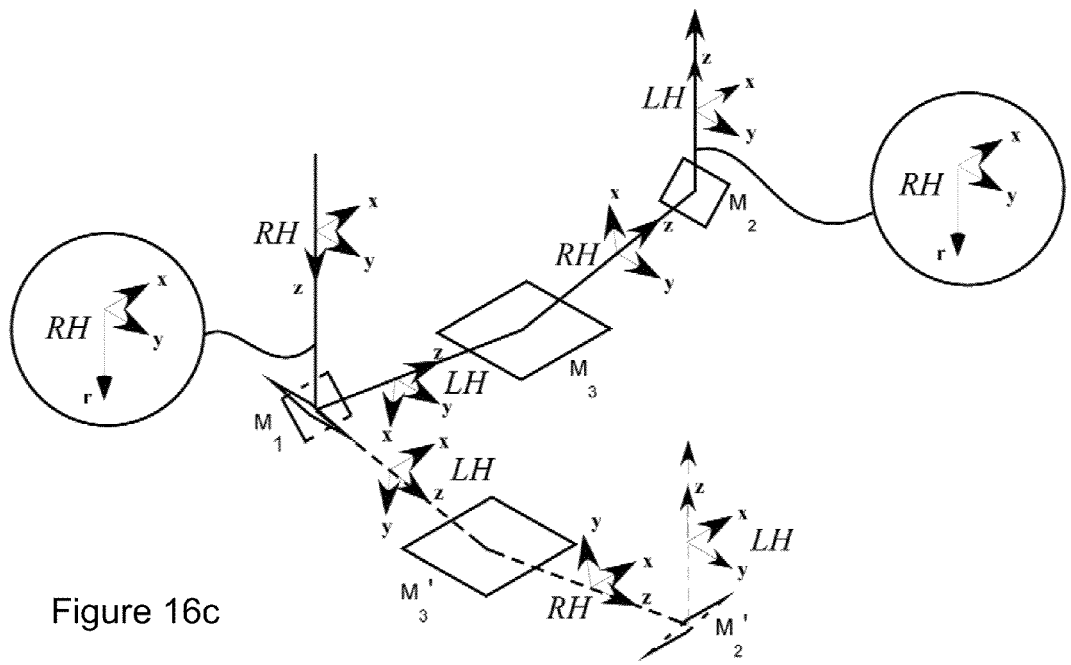
Figure 16c

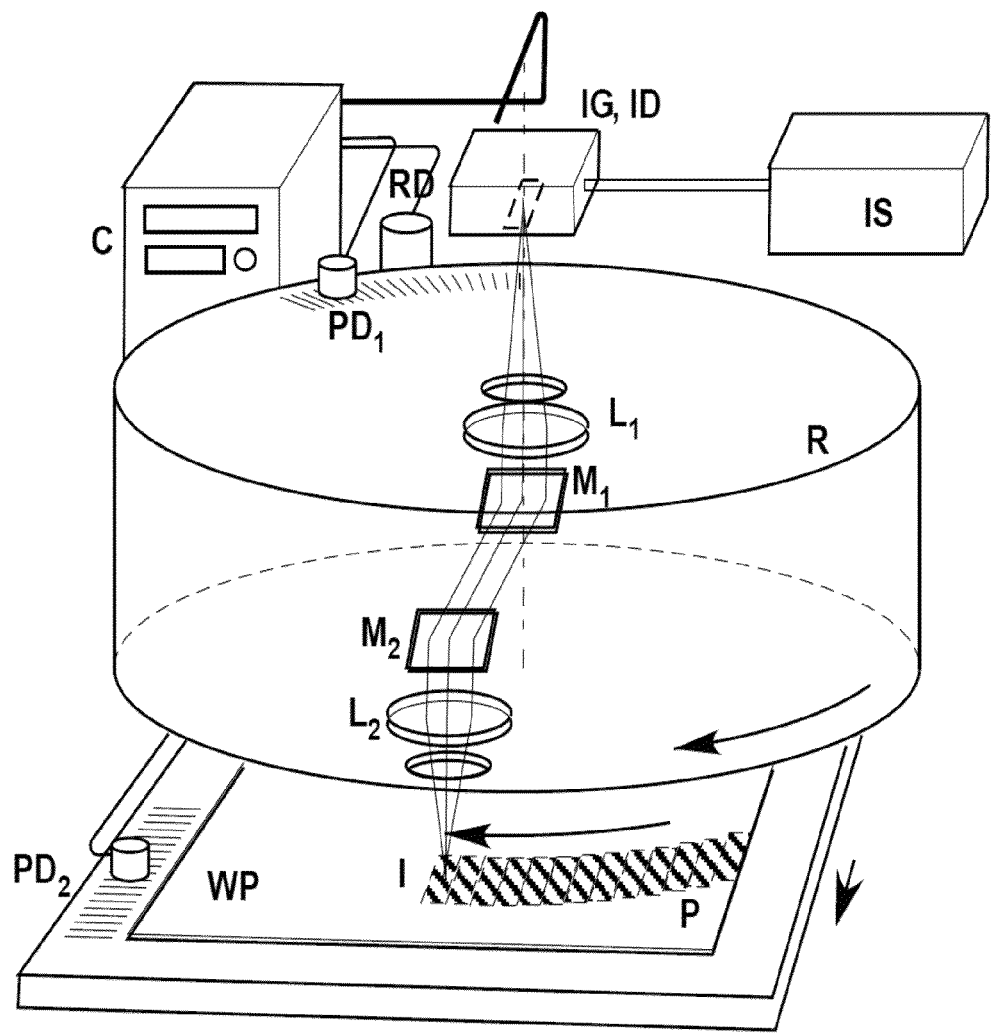
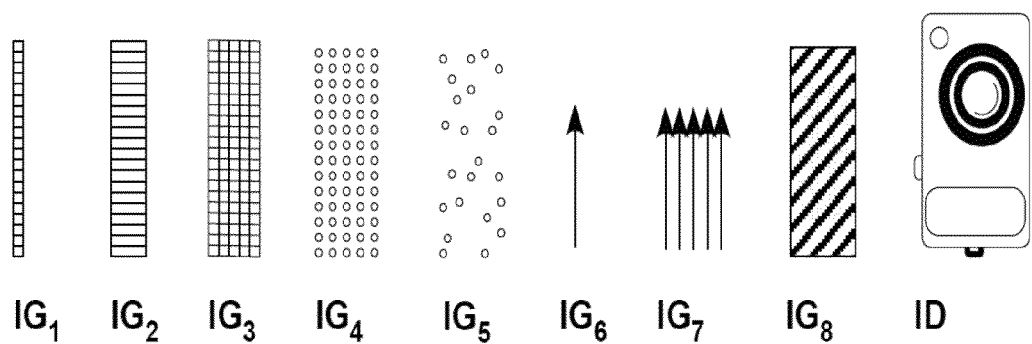
Figure 24

METHOD AND DEVICE USING ROTATING PRINTING ARM TO PROJECT OR VIEW IMAGE ACROSS A WORKPIECE

RELATED APPLICATIONS

This application is a continuation of U.S. patent application Ser. No. 12/631,653, entitled "METHOD AND DEVICE USING ROTATING PRINTING ARM TO PROJECT OR VIEW IMAGE ACROSS A WORKPIECE," filed on 4 Dec. 2009, issued on 14 May 2013 as U.S. Pat. No. 8,442,302, which claims the benefit of U.S. Provisional Patent Application No. 61/200,970, entitled, "METHOD AND DEVICE USING ROTATING PRINTING ARM TO PROJECT OR VIEW IMAGE ACROSS A WORKPIECE," filed on 5 Dec. 2008. The related applications and priority applications are hereby incorporated by reference for all purposes.

BACKGROUND OF THE INVENTION

The technology disclosed relates to scanning of large flat substrates for reading and writing images. Examples are flat panel displays, Printed Circuit Boards (PCBs) and photovoltaic panels. Reading and writing is to be understood in a broad sense: reading may mean microscopy, inspection, metrology, spectroscopy, interferometry, scatterometry, etc. of a large workpiece, and writing may mean exposing a photoresist, annealing by optical heating, ablating, or creating any other change to the surface by an optical beam. In particular, we disclose a technology that uses a rotating or swinging arm that describes an arc across a workpiece as it scans, instead of following a traditional straight-line motion.

FIG. 1 shows one variety of prior art scanning systems. A flat workpiece 110 is placed on a stage 120 and a writing or reading head 130 is scanned across it. The stage 120 advances the workpiece 110 in one direction as the head 130 scans in a perpendicular direction. A final lens 150 may be placed between the head 130 and workpiece 110. Other systems have a stationary workpiece and a scanning head that moves along perpendicular axes, such as x-y axes. Still other systems have a stationary scanning head and a stage that moves along perpendicular axes. Each of these architectures has its own mechanical characteristics that impact its effective scanning speed.

For instance, a scanning head often needs services, such as cooling water, gas, or RF cables 132. Bending of cables and support members can impact both reliability and performance. Some serviced reading and writing heads are heavy, bulky or otherwise unsuitable for fast movements.

Systems that rely on x-y stage movement typically have heavy stages with large inertia that are very stiff to avoid sag and relatively unimpacted by outside vibrations. The heavy scanning stages require force proportional to their mass to accelerate and stop as they change direction.

Problems with writing increase as the target surfaces become larger and are made from thinner, more easily deformed materials. Larger stages require increased stiffness. More easily deformed materials require pattern manipulation from one layer to the next, on a piece by piece basis.

Accordingly, an opportunity arises to develop a new fast scanning architecture with improved throughput. A relatively low cost system with high performance may result.

SUMMARY OF THE INVENTION

The technology disclosed relates to scanning of large flat substrates for reading and writing images. Examples are flat panel displays, PCBs and photovoltaic panels. Reading and writing is to be understood in a broad sense: reading may mean microscopy, inspection, metrology, spectroscopy, interferometry, scatterometry, etc. of a large workpiece, and writing may mean exposing a photoresist, annealing by optical heating, ablating, or creating any other change to the surface by an optical beam. The present disclosure provides for a method and apparatus for writing to (or reading from) a workpiece, including using a stationary optical image device, e.g. a modulator (or a detector), to form (or collect) relayed image information and further relaying the image information along optics of at least one rotating arm between the stationary optical image device and a surface of the workpiece.

BRIEF DESCRIPTION OF THE DRAWINGS

FIGS. 8a-c show examples with scan optics which give non-rotating pixel maps.

FIGS. 12a-b show an off-axis embodiment having eight arms and how a rotating prism at the hubs image data to and from each arm in turn.

FIGS. 13a-b compare on- and off-axis relay arms.

FIGS. 14a-b depict alternative ways to produce an optical axis perpendicular to the workpiece.

FIG. 15 introduces to the optical configuration a tube lens after the pyramid mirror.

FIGS. 16a-c depict conditions that contribute to maintaining the azimuthal orientation of an image.

FIG. 24 shows another embodiment of the technology disclosed with possible image generators $IG_{1-8}$ and an example image detector ID.

DETAILED DESCRIPTION

Figure 1:
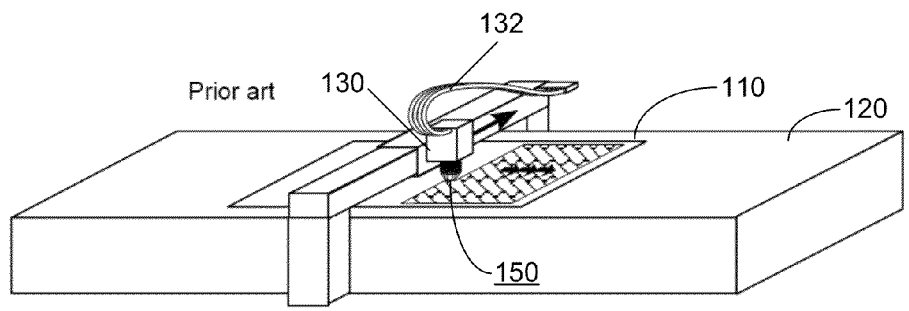
FIG. 1 shows a prior art system exposing a flat workpiece with parallel swaths and having a reciprocating scanning action.

The following detailed description is made with reference to the figures. Preferred embodiments are described to illustrate the disclosed technology, not to limit its scope, which is defined by the claims. Those of ordinary skill in the art will recognize a variety of equivalent variations on the description that follows.

This disclosure covers embodiments of a rotating arm printing or viewing device with relay optics with a hub at one end of the arm and optics at the other end, which couple image information with the surface of a workpiece. The optical coupling at the hub may be either on or off the axis of rotation.

In certain embodiments, the disclosed technology provides for a method and apparatus for writing to (or reading from) a workpiece, including using a stationary optical image device to form (or collect) relayed image information and further relaying the image information along optics of at least one rotating arm between the stationary optical image device and a surface of the workpiece. By repeatedly sweeping a curved stripe across the surface of the workpiece, a contiguous image may be written from overlapping partial images by stitching together the partial images on the workpiece.

In another embodiment, the pattern information, e.g. partial images, relayed between the optical image device and the surface of the workpiece is relayed through with a substantially constant azimuthal orientation. In yet another embodiment, the azimuthal orientation of the relayed image information is substantially constant when a set image at the optical image device maintains a constant angular relationship to relayed versions of the set image on the workpiece with no more than a 0.5 degree rotational variation in the angular relationship when the relayed versions are separated by more than 5 degrees sweep of the rotating optical arm.

Maintaining the azimuthal orientation of the image during the sweep of the printing arm makes it possible to create a contiguous pixel map representing the surface of the workpiece. In certain aspects of the disclosed technology, the pixel grid is displaced between consecutive partial images and the data path of the system must know the displacement of each field. Computational operations in the data path may then be used to compensate for the displacement of the fields in order to provide for the stitching of partial images, either before writing to or upon reading from the workpiece, e.g. the features in the data have to be moved to compensate for the displacement.

One aspect of the disclosed technology is that the arm can be placed radially in a rotating disk or rotor and the rotor can have several arms, e.g. 2, 3, 4, 6, or 8 arms, thereby multiplying the scanned surface area per time unit. Another aspect is that heavy, complex, fragile machine parts, or parts that are expensive or need many connections and services can be placed stationary near the center or hub of the rotor and be shared by the multiple arms. A further aspect of the disclosed technology is that an image is relayed between an image device placed stationary near the hub of the rotor and the workpiece through the radial arm and that the relayed image is essentially non-rotating when the rotor rotates. It is another aspect of the disclosed technology that partial images are created when the rotor rotates and that the partial images are stitched together to a continuous curved stripe. Yet another aspect of the disclosed technology is that the stitching together of partial images is done with bitmaps which are essentially non-rotating, but where the pixel grid is displaced from image to image.

This technology is disclosed by reference to relay optics because it can be used to write to or read from a workpiece. For instance, it is useful to write directly to a large area mask or a PCB. Or, it can be used to inspect a large area mask. It is used with a workpiece positioning mechanism, such as a stage, details of which are outside the scope of this disclosure.

Some particularly useful applications of this technology is for writing patterns on electronic substrates, such as wafers' front and back sides, PCBs, build-up and interposer substrates, for flexible interconnection substrates and for masks, stencils, templates and other masters. Likewise, the rotor writer can be used for patterning panels in displays, electronic paper, plastic logic and for photovoltaic cells. The patterning can be done by exposure of photoresist, but also through other actions of light such as thermal or photochemical processes: melting, evaporation, ablation, thermal fusing, laser-induced pattern transfer, annealing, pyrolytic and photo induced etching and deposition.

The disclosed technology replaces the customary Cartesian flatbed xy stage with a polar scanning motion. One of the benefits is one of higher throughput, economics and mechanical simplicity. The scanning action is done by a rotating motion which is mechanically easier to build to high accuracy than straight-line motion. The position accuracy of a point on the periphery of the rotor is determined by the quality of a bearing and the accuracy of an angle encoder, both components which can be bought commercially with high quality. Another benefit is to reduce vibrations and transient forces during scanning and between scanning strokes. A well balanced rotor emits essentially no vibrations or reactive forces to the supporting structure, while reciprocating straight movements need to reverse their momentum twice per stroke and create strong disturbances when doing so. The forth benefit is a higher scanning velocity with less mechanical overhead. With a rotor with several arms only a small portion of each stroke need to be sacrificed, e.g. a rotor with four arms may scan through an 80 degree arc and out of the 360 degrees in one turn scanning takes place during 4×80=320 degrees. A reciprocating movement will need more mechanical overhead and the overhead gets larger with increased scanning velocity.

Rotating motion has been used in prior art in drum scanners and drum plotters, with certain advantages in terms of higher scanning velocity and reduced mechanical overhead. But for substrates, especially large substrates, which cannot be mounted on a drum rotation has not been used due, perhaps, to mechanical complexity. The Applicant has found a practical way of letting a stationary image device with a small field be scanned over a large flat workpiece at high speed and to stitch together a contiguous image.

As mentioned above, systems according to the disclosure can be built with very high data rate and throughput and may be used for other types of patterning where these characteristics are useful: photo-setting, printing, engraving, security marking, etc. The rotor has a smooth movement and small mechanical overhead even at high rotation speeds, e.g. 60, 120, 300, 600 r.p.m. or higher. The scanning speed, which is the peripheral speed of the rotor, may be higher than comparable reciprocating systems, e.g. 2, 4, 8, 20 m/s or higher.

An example of a possible system is a rotor one meter in diameter, spinning 3.3 turns per second with a centripetal acceleration of 20 g. The acceleration force gives a constant force on rotating components, such that a lens weighing 50 grams will feel a constant force outwards of 10 N. With four arms it writes 13 strokes per second with a peripheral velocity of 10 m/s, a mechanical speed which is quite impossible with a reciprocating stage. Furthermore, with proper balancing and design of the bearings the motion will be smooth, have high mechanical precision and need only little power to be sustained. If the image generator is a micromechanical 1D SLM with 2 MHz frame rate used for creating a 1D partial image on the workpiece, the reloading of the SLM would occur every 5 microns along the scanning direction and the pixel size could be 5×5 microns, allowing line width of less than 15 microns to be written. With a micromechanical SLM, e.g. a 1D SLM, having approximately 8000×1 pixels, each stroke would fill a stripe 40 mm wide with pattern, and cover—with some reduction for the non-straight scan—0.3 square meters per second or 20 square meters per minute. This is a very high coverage rate, compared to other writing technologies.

One aspect of the disclosed technology is the introduction of rotating optics for printing an essentially non-rotating image on the workpiece. The disclosure also gives the conditions for an exactly non-rotating image. In practical cases it may be suitable to deviate slightly form these conditions, e.g. for reasons of physical space near the hub of the rotor. The disclosed technology does still work for small deviations in the angles, but they have to be corrected for in the data handling. This will be described further on.

Hence, the disclosed technology provides for a rotating scanning architecture for fast writing (or reading) of a pattern on a workpiece with a very high coverage rate compared to other writing (or reading) technologies. As mentioned above, the rotating scanning architecture of the disclosed technology may nevertheless allow line widths of less than 15 microns to be written. State of the art writing (or reading) systems that rely on x-y stage movement typically have heavy stages with large inertia that often are very stiff in order to avoid sag. These heavy stages require a force proportional to their mass to accelerate and stop as they change direction. By introducing a rotating scanning architecture with smooth movement and small mechanical overhead even at high rotation speed, the disclosed technology provides for a solution with improved performance that also addresses the above-mentioned problems associated with the heavy stages and large inertia of state of the art x-y stage systems.

Figure 4:
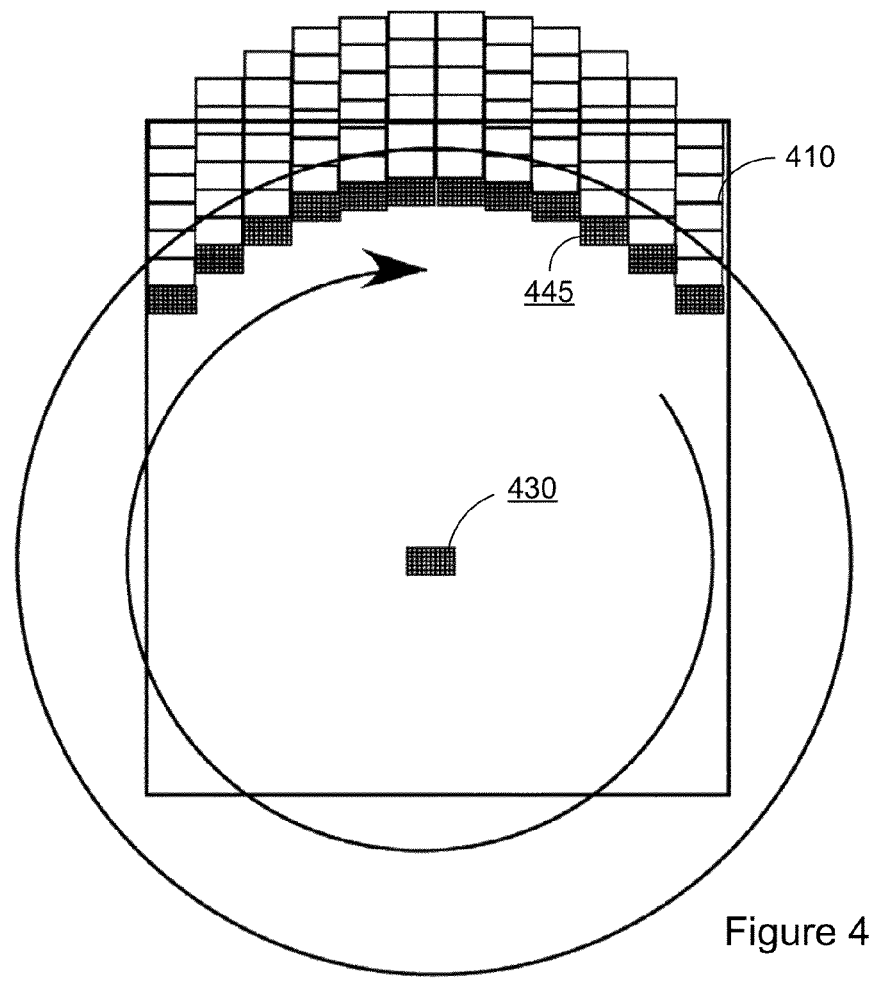
FIGS. 4-5 depict stitching together of successive stamps, when the stationary image device is two dimensional. Alternatively, a sweeping action can be used, instead of a stamping action, to relay information between the stationary image device and the surface of the workpiece.
Figure 5:
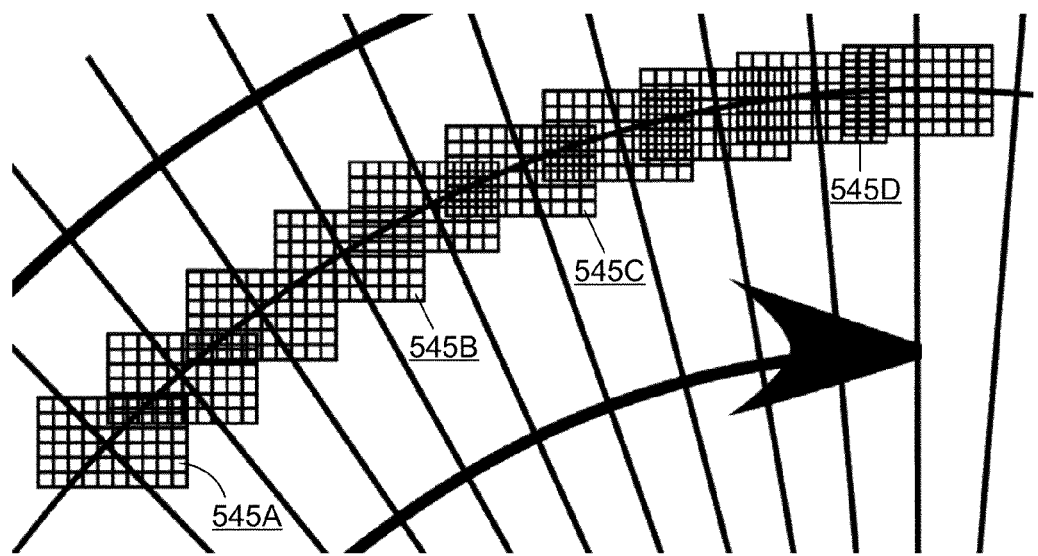

The optics relay an image through the rotating arm(s) while maintaining the azimuthal orientation of the image as the arm scans the workpiece. We define azimuthal orientation with the following example: Consider an arm oriented at noon on a clock face. In this position, the letter "R" has an upright orientation at both ends of the optics, relative to noon on the clock. Then, when the arm is repositioned at 10 or 2 o'clock, the letter "R" would still have the upright orientation at both ends of the optics. In a writing device, a projected "R" would be printed with the same upright azimuthal orientation at all three positions, 10, 12 and 2 o'clock. Or, in an inspection device, three "R" images positioned upright at the 10, 12 and 2 positions on the workpiece would be viewed as the same. Alternatively, the letter "R" could be inverted, rotated or transformed by the optics. Still, even after these transformations, the projected image would have the same azimuthal orientation at all three positions, 10, 12 and 2 o'clock. Maintaining the azimuthal orientation simplifies printing. FIG. 4 shows fields 445 that are written or read when the rotor with non-rotating optics is rotated (an example with a two-dimensional fields e.g. from an SLM or CCD camera at the hub 430). The fields in FIG. 4 are taken at intervals which are chosen so that the pixel grid in the horizontal direction is maintained. The pixel grid in the vertical direction is different for each field with a displacement which is given by the curvature of the stripe. FIG. 5 shows a similar example where the fields are taken without regard of the horizontal grid, e.g. at equidistant times. The pixel grid is displaced in both x and y between consecutive fields. In order to stitch together a contiguous image the data path of the system must know the displacement of each field.

For a writing system the features in the data have to be moved to compensate for the displacement and the pixel grid displacement need to be taken account of while creating the bitmaps for the writing hardware. For a reading system the field may be stitched by known methods used for photographs, e.g. for stitching together panoramas from multiple images. In either case there is a physical image on the surface, which is handled by the image device in displaced fields, and in the data path or image processing computer, i.e. before writing or after reading, it exists as a contiguous image file without reference to the writing or reading hardware, i.e. all parts of the contiguous image have a common reference grid. Bitmaps that represent the partial images may be converted between the grid of the hardware and the reference grid by methods well known in the art of image processing, e.g. algorithms for so called "image morphing", after the grid of the partial images have been determined from the machine geometry. The signal processing methods devised by the Applicant for stitching displaced image fields together may also be used with image fields that are rotated. Small rotations are much easier to handle than large ones, which have problems with moiré effects, loss of definition, and inefficient use of the sensor area. Therefore it is easier and the image quality and speed are better with non-rotating fields, and the second best is a field that rotates only by a fraction of a pixel between adjacent partial images.

Likewise the technology disclosed enables many instruments to be used on large flat substrates and scanning at high speed, e.g. on solar panels, display substrates, sheet metal, architectural glass, roll-to-roll plastic, paper, and the like. Through the rotating arms an image may be captured at the periphery and transferred to the hub where a camera or detector (e.g., a vidicon, CCD, CID, CMOS device, and/or a TDI, intensified, gated, avalanche, single photon, photon-counting, interferometric, colorimetric, heterodyne, photoconductive or bolometric detector or array) is located, or an optical analytical instrument may be situated, (e.g., a reflectometer, spectrophotometer, colorimeter, scatterometer, multispectral camera, polarimeter, or a fluorescence, photo-luminescence or photoacoustic instrument).

Other possible uses are for optical measurements of heat (infrared emission), color, flatness, smoothness, film thickness, chemical composition, cleanliness, or for verification of pattern integrity or fidelity. The method is particularly beneficial where an image of the surface or an exact location of a found defect or feature is needed. Instruments that are complex, bulky or fragile can be mounted fixed at the hub and still access any point on the surface of, say, a two meter wide thin-film photovoltaic panel passing on a conveyor under the rotor, thereby enabling full-area inspection or analysis at dense grids on large workpieces without removing sheets for analysis or stopping the roll-to-roll flow. The rotor may have only flat optics or it may have reflecting relays in the arms, allowing achromatic use from far IR to deep UV. The illumination (e.g. visible incident light for reflected-light microscopy or UV for fluorescence studies,) may be brought from the hub or it may be generated within the rotor. Several instruments and or writing modes may be combined in one rotor, either by being combined in one optical arm or by employing different ones. The rotation may be continuous with a constant or varying angular speed or alternatively be driven by in a stop and go fashion, in particular for random-access analysis of workpieces. Focusing of the imaging optics may be fixed, variable from time to time or dynamic during scanning and based on feedback from focus sensors based on interferometry, back-reflection, proximity to a fiber end, optical triangulation, optical defocus or parallax; fluid flow, pressure or viscous resistance; ultrasound time-of-flight or phase; capacitance, inductance or other suitable phenomena indicating a distance or position.

With the image orientation preserved by the rotating optical arm, computation of overlapping images is enabled or simplified, even though the overlap between stamps changes with the angle course of rotation, as illustrated by FIG. 5. One image "stamp", for instance produced by a flash of radiation, can be related to another by a simple displacement vector, without worrying about rotation or skewing of the image. A second displacement vector can account for movement of the workpiece between flashes, if it is in motion. The two displacement vectors can be added.

The more detailed disclosures that follow depict two families of optical arrangements. The first family uses an optical relay on the axis of rotation. In two embodiments, flat and curved mirrors are placed on-axis. In variations, one or more arms can be used for relaying information between a hub and a distal arm end that sweeps the workpiece. The second family uses an optical relay near the hub, which is off-axis. Examples of off-axis relays include triangular, square pyramid and mirrors such as multifaceted mirrors.

In certain embodiments of the disclosed technology, the optical relay is an image-deflecting device, such as a prism or mirror, which may be placed on or off-axis and is rotating about the axis of rotation. The image-deflecting device may e.g. be a separate element having its own movement, e.g. a rotational movement, which at least during certain periods of time is synchronized with the rotational movement of the axis of rotation of the hub or the image-deflecting device may also be an integral part of the rotating hub.

Substantial scanning speeds can be achieved using one or more rotating optical relay arms. The motion of the workpiece need not be reversed as many times with rotating optics as with scanning optics, because a wider stripe of the workpiece can be scanned. Alternatively, much less expensive optics can be used to accomplish a wide scan field.

Figure 2:
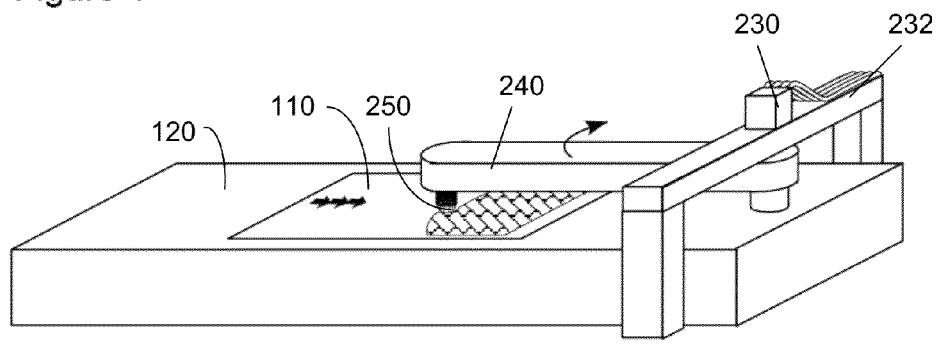
FIG. 2 shows an example embodiment where the same workpiece as in FIG. 1 is exposed with a rotating action using a stationary writing head and rotating scan optics.

FIGS. 2, 4 and 5 show exemplary embodiments of scanning through an arc, instead of using a straight motion. In all of the figures, the optics are greatly simplified to improve comprehension of the mechanical relationships among components and to focus the reader on the rotating arms. The reading/writing head 230 is stationary. The optical image is relayed by a rotating or swinging optical system 240 between a position near the axis of rotation and a position away from the hub 250. The rotating optical system may be simple and light, e.g. consisting only of two parallel mirrors. It scans a circular arch over the workpiece (FIGS. 4-5) or swings (FIG. 2). The workpiece 410 is moveable, at least relative to the center of rotation of the optics. The workpiece may be moved either continuously or in steps, so that the scanning optics can reach all parts of the workpiece. A control system knows from the actuators driving the motions or from position and/or angle encoders which part of the workpiece is being written to/read from. For writing, the controller controls the sending of the data intended to be written to the addressed area, and for reading the read image or data is recorded or analyzed with awareness of where it came from. Maintaining the azimuthal orientation of the image 430, 445 during the sweep of the printing arm makes it possible to create a contiguous pixel map representing the surface of the workpiece, either before writing to or upon reading from the workpiece. Note that the overlap between stamps depends on the position of the distal arm, e.g., 545A-D, in the arc of rotation.

Circular motion is easier to control than a linear one. Bearings, e.g. fluid bearings, define the center of rotation accurately. If the rotating part is made as a wheel with balancing masses around the center of rotation and given a continuous rotational moment, the only energy needed to sweep the scanning arms compensates for the friction in the bearing. A rotor, including rotating optics and a mechanical support, may be completely passive. All active parts such as motors, cooling, sensors etc. may be part of the base and stage.

The technology disclosed replaces the reciprocating motion of an x-y scanning system with a continuous rotation of optical arms. This rotation exchanges no energy and little or no vibration with the environment. By comparison, reciprocating motion at 1 m/s causes vibrations and reciprocating mechanical forces in the supporting structure, while a rotating balanced scanner may go 10 m/s very smoothly. Replacing reciprocating motion with circular motion solves practical problems in optical scanning systems, in particular for flat workpieces.

Figure 3:
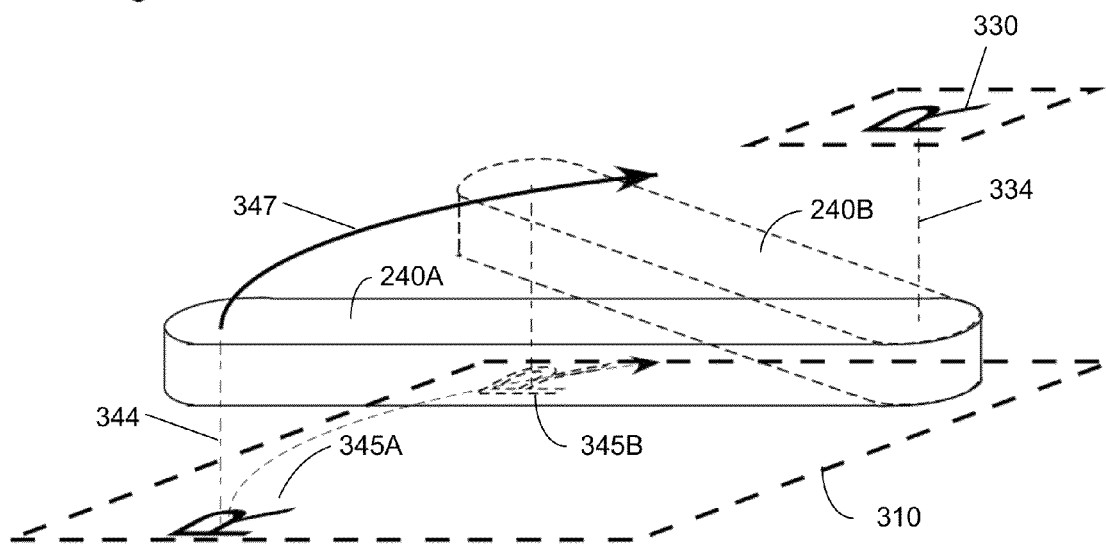
FIG. 3 shows an example embodiment with the same orientation of the image going into and coming out from the scan optics.

Maintaining the azimuthal orientation of an image is illustrated in FIG. 3. The azimuthal image at the hub 330 is relayed to the end of rotating arm 240A, 240B. The distal image 345A, 345B has the same azimuthal orientation as the hub image 330. In the illustrated embodiment, the relay axes 334, 344 are parallel and transmitting image information in the same direction.

FIGS. 16a-c depict and define the optical parity of the relayed image. The light is propagating through a rotating optical system indicated by the mirrors M1 and M2. Mirror M1 is at or near the axis of rotation. Mirror M2 is at the distal end of an optical arm that rotates about a hub. Mirror M2' (prime) represents mirror M2 in a rotated position. The light beam contains information about an image with an x and a y direction. The x and y directions, as they enter the rotating optical component, combine with a propagation direction z to form a three dimensional coordinate system with a certain handedness, shown as right-handedness ("RH") in the figure. The rotating optics may transform the image information before the light hits the workpiece. The x and y directions of the image information may be transformed, but they will retain some right- or left-handedness relative to the direction of propagation. A condition for the image to be non-rotating is that the handedness is the same before and after the rotating parts, if the directions of entry into and exit from the rotating optics are parallel and the handedness is opposite if the directions are anti-parallel. This is shown in the figures. In FIG. 16a, the handedness before mirror M1 is the same as the handedness after mirror M2. The entry and exit are parallel, both initially and when the mirrors are rotated 90 degrees to a new position (indicated by dashes) from the original position (solid) the x and y axes have not rotated. In FIG. 16b, mirror M2 is mounted differently so that the z axis is reversed. The xyz system is still right-handed, but the directions of propagation before and after the rotating parts are anti-parallel. In this case, it is seen that when the mirrors rotate through 90 degrees the x and y axes in the outgoing light beam are rotated by 180 degrees. In other word, the azimuthal relationship between the image information entering and exiting the rotating optics is not maintained when the handedness violates the rules given above. Finally, in FIG. 16c, a third mirror M3 is introduced to reverse the handedness of the xyz coordinate system, making xyz left-handed LH. The reverse handedness combined with the anti-parallel entry and exit to the rotating optics results in x and y orientation that are non-rotating.

A different way of expressing the condition is to form a xyr coordinate system before and after the rotating parts, where r is the rotation vector i.e. it is parallel to the axis of rotation and the rotation is clockwise when looking along r. The condition for a non-rotating image is that the handedness of xyr is the same before and after the rotating parts. This last way of formulating the condition together with the restriction that the magnitude of r (i.e. speed or angle of rotation) is also the same allows the condition for non-rotating image to be generalized to more complex geometries.

FIGS. 4-5 depict stitching together of successive stamps, when the stationary image device is two dimensional. Alternatively, a sweeping action can be used, instead of a stamping action, to relay image information between the stationary image device and the surface of the workpiece. In a sweeping action, the image device may be one-dimensional or may be an array of beams and may more or less continuously relay image information as it sweeps along an arc. In FIG. 4, the stationary image device 430 is at the center of a circle described by one or more optical arms that rotate about a hub. In this figure, the rotation is clockwise. Stamps 445 map to the surface of the workpiece 410. Typically, stamps from writing are produced by a pulsed laser and SLM, DMD, GLV, liquid crystal shutter system or similar device for creating an image. Stamps for reading, as used in inspection or metrology, for instance, relay information in the reverse direction. FIG. 5 shows how the overlap or so-called stitching between successive stamps 545A-D depends on the position of the optical arm relative to the workpiece 410.

Figure 6:
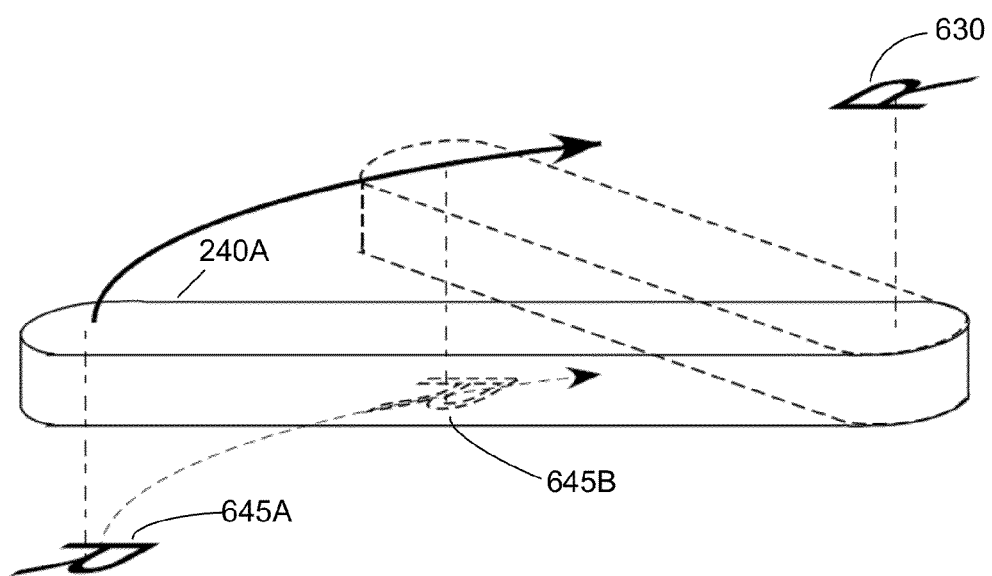
FIG. 6 shows the same type of scanning action as in FIG. 3, but with the image rotated 180 degrees.

FIG. 6 shows the same type of scanning action as in FIG. 3, but with the image rotated 180 degrees. Rotation and isotropic magnification or demagnification are optical operations that preserve the so-called parity of the image. In a system with parallel axes at the hub and distal end, the parity of the image is the same going into and coming out of the scan optics when the image is reversed an even number of times (0, 2, 4 . . . ). Maintaining the parity of the image simplifies fusion of partial images. A system with anti-parallel axes is a special case, which we discuss in connection with FIG. 8c, below.

Figure 7:
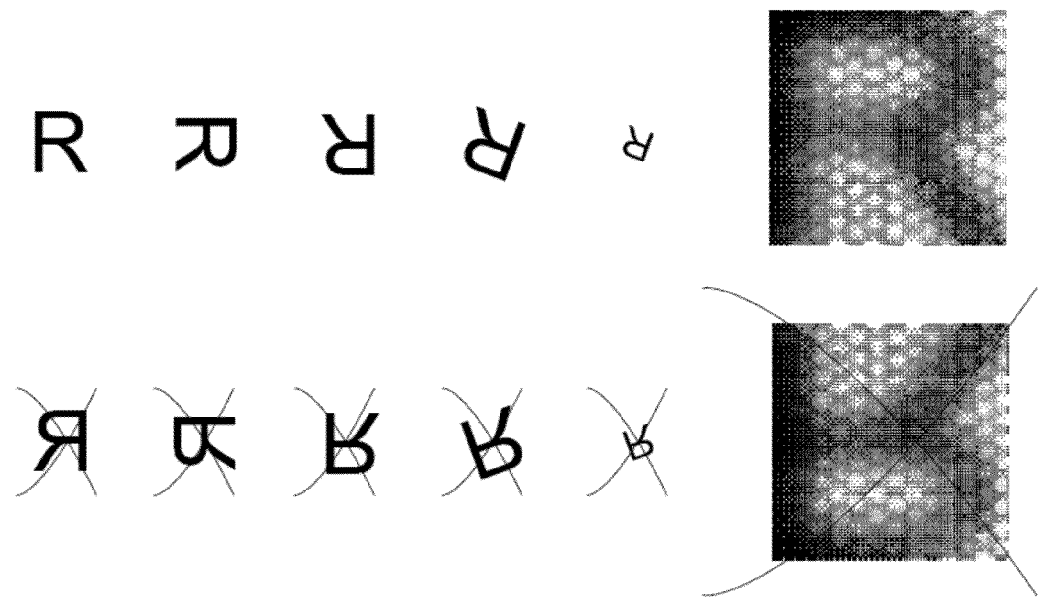
FIG. 7 shows in the upper row rotated and isotropically magnified images that are compatible with a non-rotating pixel map. In the lower row are examples of reversed images that are incompatible.

FIG. 7 shows in the upper row rotated and isotropically magnified images that are compatible with a non-rotating pixel map. In the lower row are examples of reversed images that are incompatible with straightforward fusion of successive images.

FIGS. 8a-c show examples with scan optics that give non-rotating pixel maps. FIG. 8a illustrates a writing (or reading) system with two parallel mirrors 852, 854 and image forming optics before the mirrors 861. The axes 857, 857 at and away from the hub are parallel. FIG. 8b illustrates a reading (or writing) system with two parallel mirrors with a symmetrical optical system 862, 863 in the scan arm. FIG. 8c shows a system where the light beam is directed above the axis of the scan arm and hits an optical component 864 such as a stationary external mirror. The optical component 864 addresses the case of anti-parallel image paths at and away from the hub.

Figure 9:
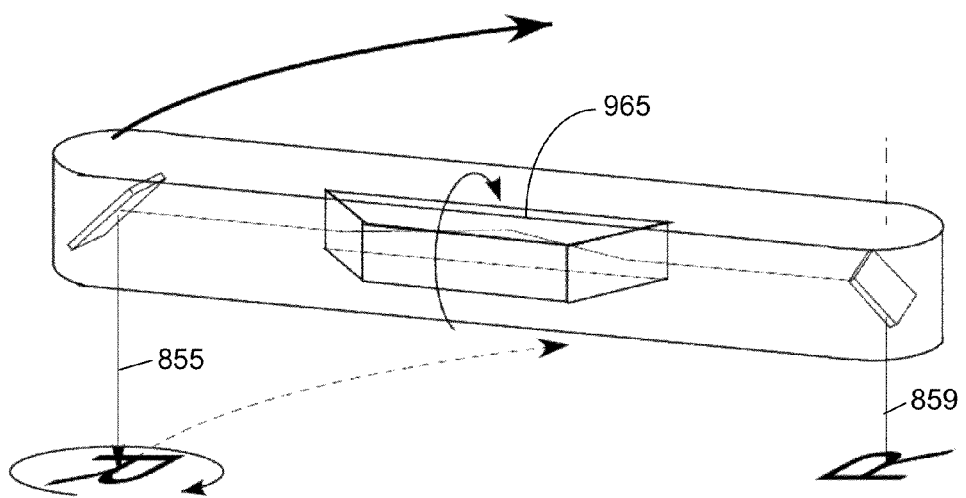
FIG. 9 shows an example system with a mirror system which can be set to any desired orientation of the image at the exit from the scan optics, having a Dove prism for rotation of the image.

FIG. 9 shows an example system with a mirror system that can be set to any desired rotation of the image 855, 859 between entrance to and exit from the scan optics. A Dove prism 965 is one optical component suitable for rotation of the image. If the Dove prism is set to a fixed angle the image will be non-rotating, but turned by twice the angle of the Dove prism. Rotating the Dove prism while rotating the arm may be a way of controlling the rotation of the image with high precision, e.g. for cancelling a residual rotation due to non-perfect angles.

Figure 10A:
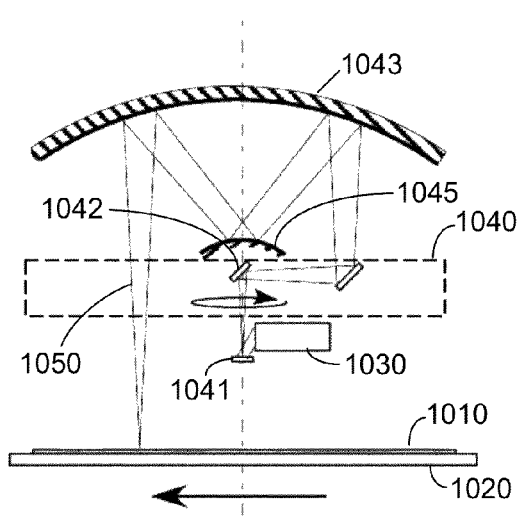
FIGS. 10a-b show a pair of on-axis writing or reading systems that have a writing or reading device projected at the center of the hub, on its axis of rotation.
Figure 10B:
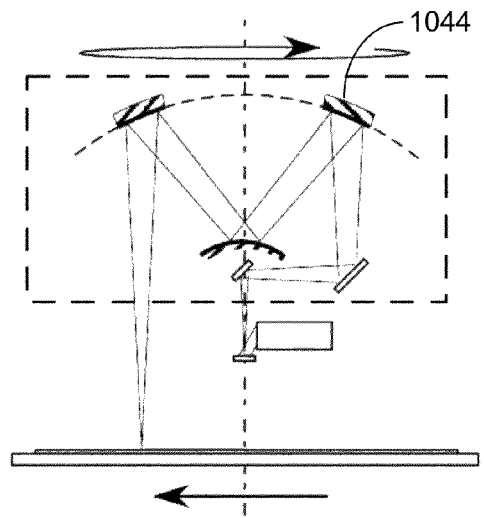

FIGS. 10a-b show a pair of on-axis writing or reading system that have a writing or reading device projected at the center of the hub, on its axis of rotation. The writing or reading device 1030 may be any image-forming device, e.g. an SLM or display, or an image-collection device such as a camera or other detector. Both systems use a catadioptric system for scanning the image on a radius. The rotating portion of the scan optics is the part inside the dashed rectangle 1040. The system uses an Offner projection system with small 1045 and large 1043 stationary mirrors. Image data 1050 directed for or from the workpiece is reflected off the stationary mirrors 1043, 1045 onto a series of rotating mirrors, including at least one on-axis mirror 1041, from or to the writing or reading device 1030. The workpiece 1010 is carried on a stage 1020.

FIG. 10b shows a similar system where a large stationary mirror 1043 is replaced by a smaller curved section of a mirror 1044. In this configuration, the size of the sectional mirror 1044 can be reduced by setting the curved mirrors 1044, 1045 in motion, or at least setting the reduced size sectional mirror 1044 in motion.

Figure 11:
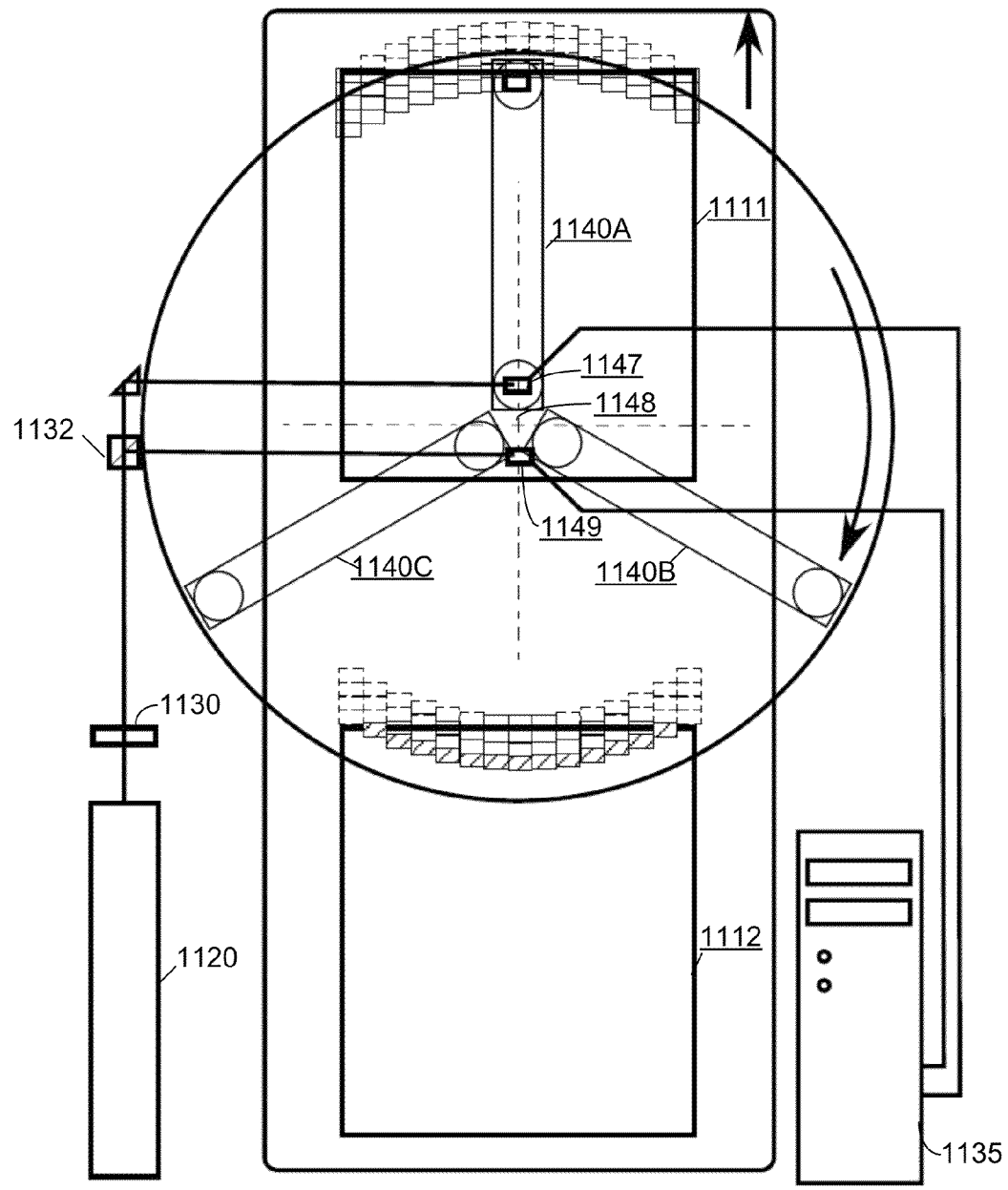
FIG. 11 depicts a scanning system with three arms and a pair of workpieces being written on opposite sides of the hub.

Systems with three, four or more arms are contemplated to increase the duty cycle of the system, so that writing or reading occupies a greater proportion of each rotation of optics. FIG. 11 depicts a scanning system with three arms and a pair of workpieces 1111, 1112 being written on opposite sides of the hub 1148. This system may have a duty cycle of 100%. Each rotor writes through an arc of 60 degrees. Only one arm 1140 writes at a time, alternatively on the two workpieces 1111 and 1112. The laser energy is switched by polarization control 1132 between the two SLMs 1147 and 1149, and the data stream is also switched between the SLMs. Since the laser 1120 and the data path 1135 are among the most expensive modules in a writing machines, this embodiment has been designed to use laser and data channel 100% of the time while the SLMs and the optics in the arms has lower duty cycles, 50% and 33% respectively. This may be, for instance, an example of a writing system with three rotating arms 1140A-C. Each of the arms may correspond in design to any of FIG. 3, 5, 8a-c or 9. The figure conceptually depicts a laser 1120 and a controller 1135 sending data to two SLMs 1130 which are relayed 1132, 1147, 1149 to the rotating arms. It shows how each arm moves in front of each SLM and writes a series of concentric stamps on the workpieces 1111, 1112. While two workpieces are shown in this figure, more workpieces could be positioned under a rotor, depending on its size. While the example is described as a writing system, the direction of relay could just as easily be from the workpiece back to a pair of detectors positioned where the laser 1120 is and elsewhere.

FIGS. 12a-b show an off-axis embodiment having eight arms and how a rotating prism at the hubs image data to and from each arm in turn. FIG. 12a is a side view that reveals the workpiece 1210 and stage 1220. The laser 1230 (or detector) relays data over an off-axis mirror or other optical element 1242 to a rotating mirror or prism 1271. A pair of mirrors or prisms 1248, 1249 rotate with the arms. Using pyramidal optics, one side of the optical element 1248, 1249 pushes image data between the prism 1271 to the large stationary mirror 1243 and the other side pushes image data between the large stationary mirror 1243, a distal mirror 1247 and the workpiece 1210.

FIG. 12b is a top view of the system described immediately above. The large stationary mirror 1243 is shown and cut away to reveal underlying features. The small stationary mirror 1245 is also shown and cut away to reveal the rotating prism 1271. The small stationary mirror has been slightly offset in the drawing, instead of centered as it would be in the device, to make the rotating mirror 1271 more apparent.

Additional drawings further explain off-axis geometries. FIGS. 13a-b compare on- and off-axis relay arms. The side views clearly contrast the relay at the hub, between the on-axis arrangement of FIG. 13a and the off-axis arrangement of FIG. 13b. The side view more clearly illustrates this compared with the top view. A pair of top views contrasts a simple rotating mirror 1370 and a multi-faceted off-axis prism or mirror 1371. As an arm rotates from zero to 45 degrees in an on-axis system, the optical relay is essentially invariant. An off-axis system is different, as the distance from the axis to the exact relay point on the multi-faceted element 1371 changes. The part of the multi-faceted element 1371 that forms the relay shifts from one side of the arm's center line 1341 to the other. In some embodiments, this requires a larger optical element 1362 positioned distal to the hub than required for an on-axis system, which keeps the relay on the arm's center line 1341.

FIGS. 14a-b depict alternative ways to produce an optical axis perpendicular to the workpiece 1430, using a non-parallel axis at the hub 1412, which is tilted relative to the axis of rotation 1410. These embodiments bring the optical relay to the center of a distal lens 1426 in both the base and rotated cases. In FIG. 14a, the interior angles are equal between the relay 1424 and the axes at the hub and onto the workpiece 1430. To match these angles, the relay 1424 between the hub optics 1420 and the distal optics 1428A is out of the plane perpendicular to the axis of rotation 1410. In FIG. 14b, the angle of the hub optics 1422B is adjusted from 1422A, to keep the relay 1424 between the hub optics 1420 and the distal optics 1428A in the plane perpendicular to the axis of rotation 1410. The adjusted angle of the hub optics facet produces unequal interior angles between the relay 1424 and the respective axes at the hub and onto the workpiece 1430. The angle at the distal optical element 1428B is a right angle, between the plane perpendicular to the axis of rotation and perpendicular to the workpiece.

Using a tilted angle of incidence at the hub, so that that relay leg is not parallel to the axis of rotation, produces a certain image rotation. In most cases, this image rotation is small, less than 0.5° over a range of pyramid rotation angles of 0-45°. Alternatively, the image rotation may be less than 0.5° over a range of pyramid rotation angles of 0-5°.

FIG. 15 introduces to the optical configuration a tube lens after the pyramid mirror. The tube lens objective is arranged so that the system is telecentric. Somewhat oversized lenses are required to accommodate the pyramid mirror. In various implementations, the beam incident to the pyramid mirror may be parallel to the axis of rotation or tilted.

Figure 17:
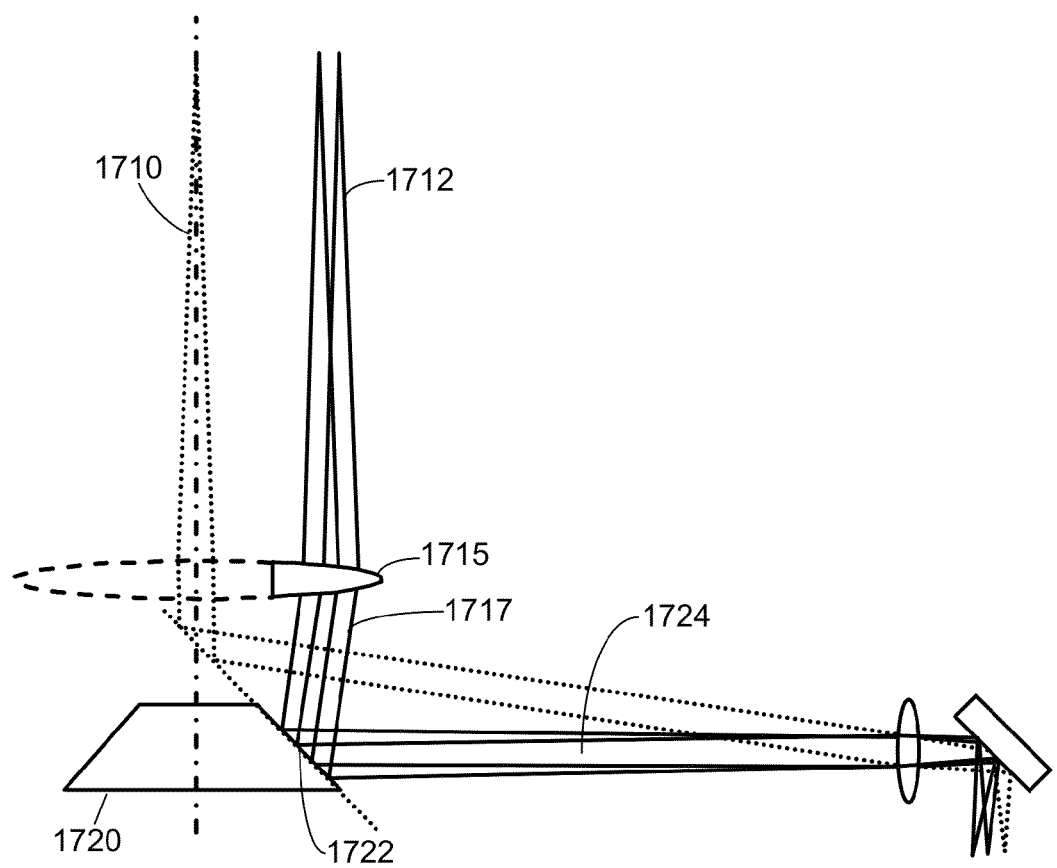
FIG. 17 depicts yet another optical configuration that mitigates rotation of a relayed image by keeping the inboard relay leg parallel to the axis of rotation.

FIG. 17 depicts yet another optical configuration that mitigates rotation of a relayed image by keeping the inboard relay leg 1712 parallel to the axis of rotation 1710. The lens section 1715 is not symmetrical with respect to the axis of the relay leg 1712, so the relay leg after the lands 1717 is bent toward the surface 1722 of the pyramid mirror 1720. The relay along the arm 1724 is perpendicular to the axis of rotation.

Figure 18:
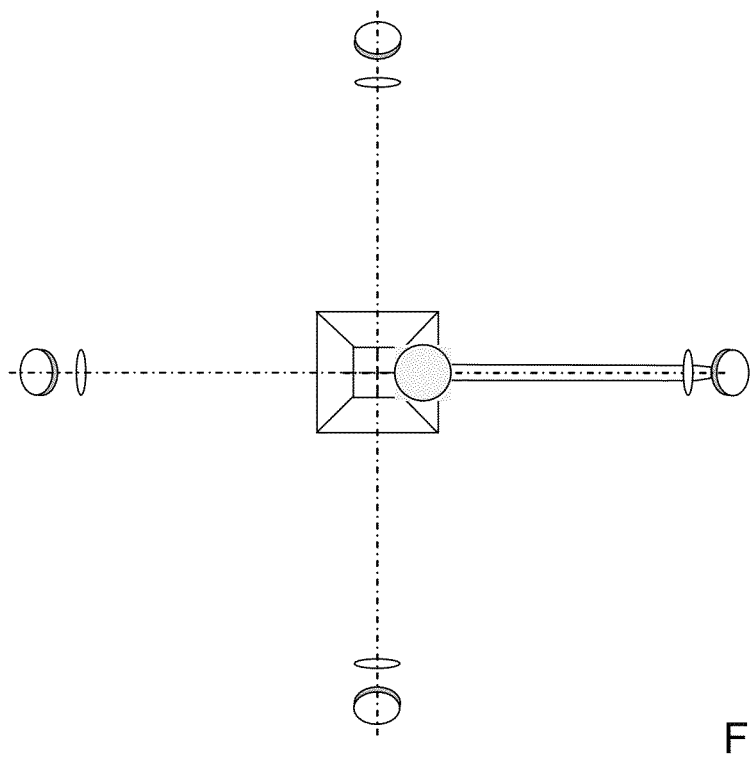
FIGS. 18-19 illustrate the use of a four sided and three sided pyramid mirror.
Figure 19:
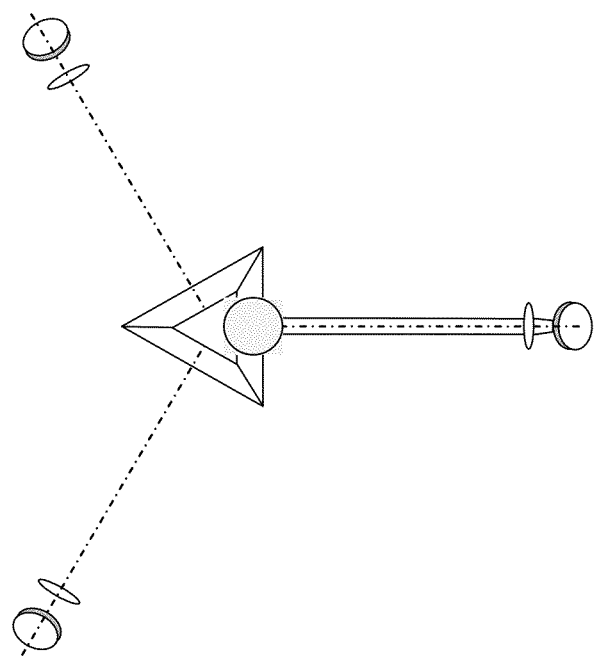

FIGS. 18-19 illustrate the use of a four sided and three sided pyramid mirror, respectively. Both of these implementations are off-axis. Larger numbers of sides can be used on the pyramid mirror. The practical trade-off is between lost projection time, when the beam is straddling two facets of the rotating mirror, which is unfavorable, and a reduced in radius between the center and edges of a facet, which favorably impacts the relay of image information along the optical arm, keeping it closer to the center line of the arm.

Figure 20:
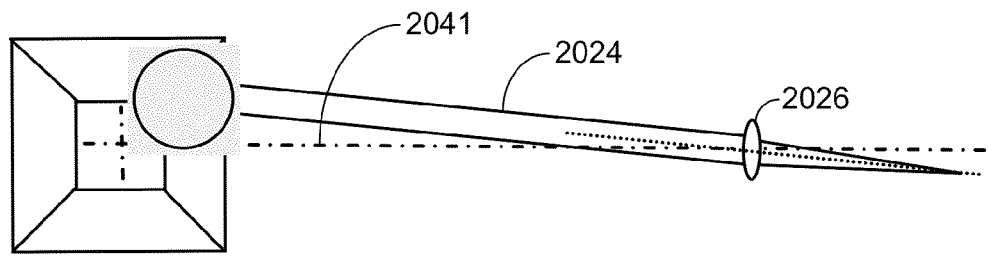
FIG. 20 illustrates use of a small size objective lens.

FIG. 20 illustrates use of a small size objective lens 2026. The rotor scanner is designed so that the beam is aimed near the front surface of the objective lens, which reduces the size of the objective lens. The small lens, on the other hand, is not strong enough to bring the relay leg 2024 coincident to the centerline of the arm 2041. As result, the focused beam will not be perpendicular to the workpiece.

Figure 21:
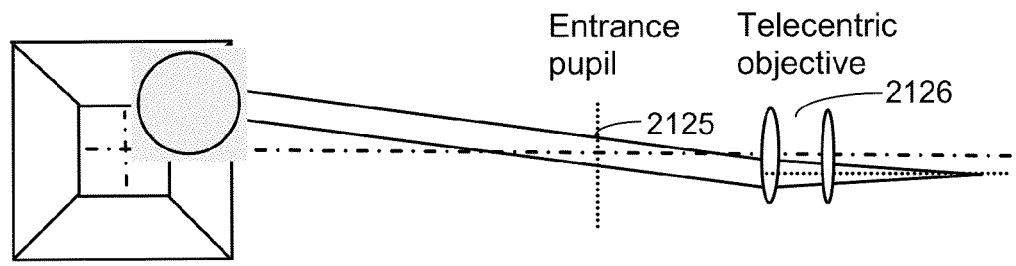
FIG. 21 illustrates a design in which the beam is focused at an entrance pupil and relayed through a telecentric objective lens system.

FIG. 21 illustrates a design in which the beam is focused at an entrance pupil 2125 and relayed through a telecentric objective lens system. However, this requires a larger objective lens and a more complex optical design.

Figure 22A:
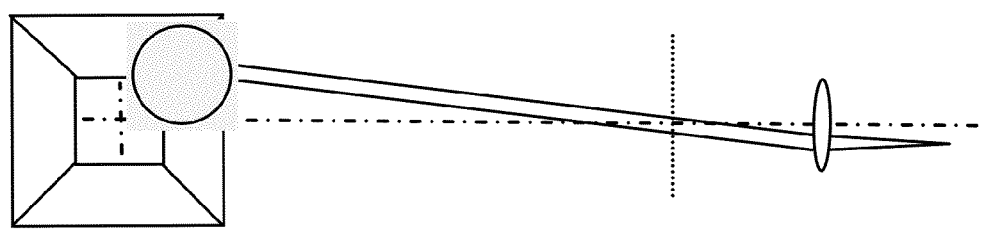
FIGS. 22a-b contrast use of a large pyramid mirror with optics the permit use of a smaller pyramid mirror.
Figure 22B:
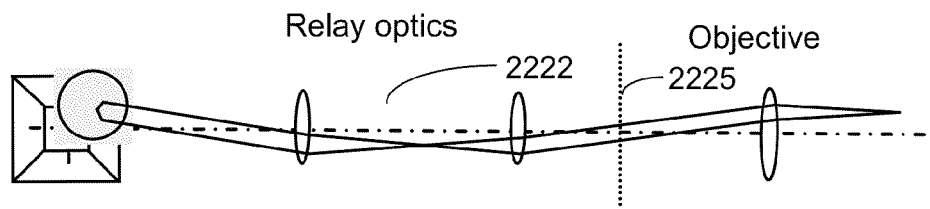

FIGS. 22a-b contrast use of a large pyramid mirror with optics the permit use of a smaller pyramid mirror. Use of relay optics 2222 before the entrance pupil 2225 enables use of the smaller mirror.

Figure 23:
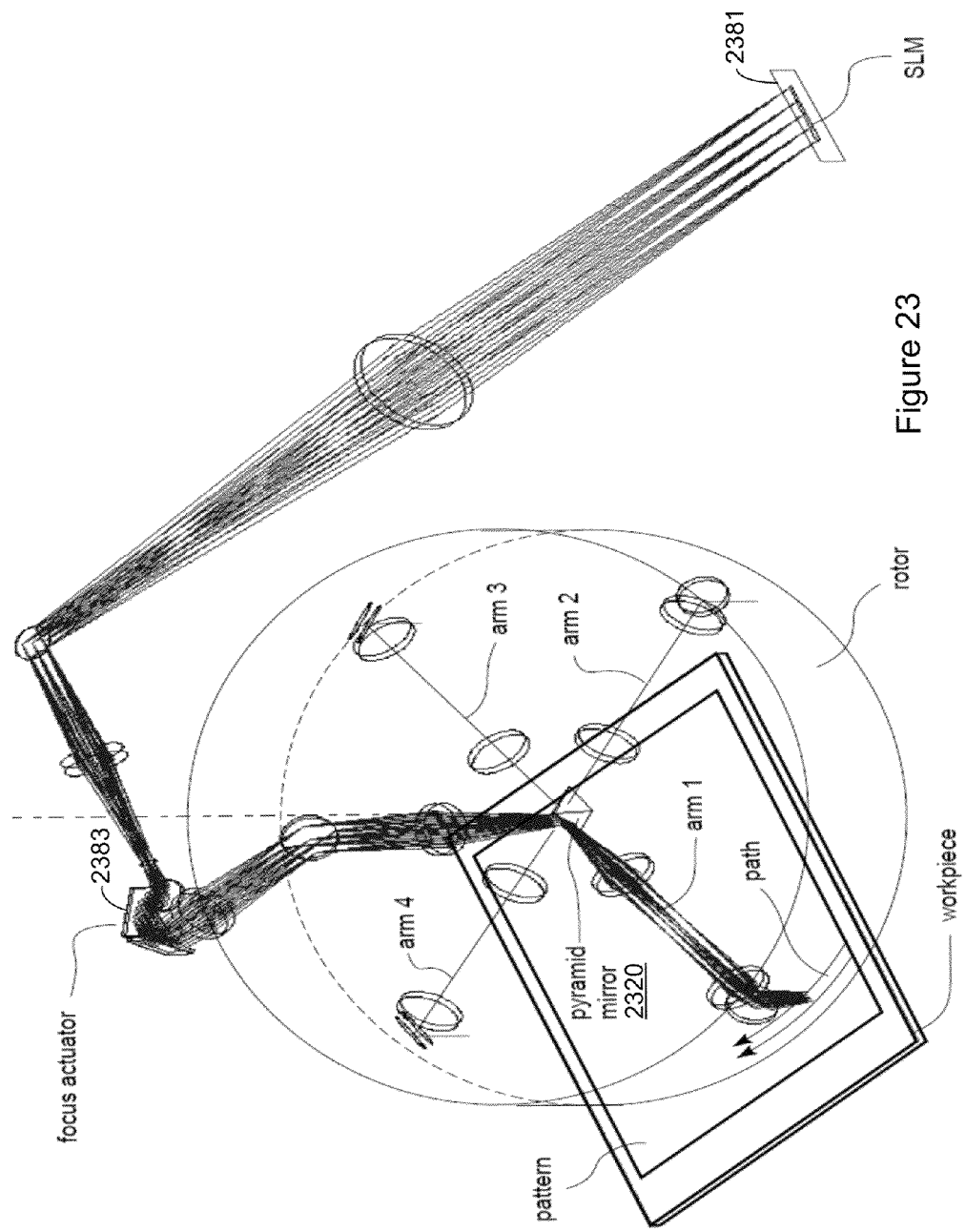
FIG. 23 depicts simplified optics.

FIG. 23 depicts simplified optics that relay the image information from an SLM or detector 2381 through a focus actuator 2383 and onto the pyramid mirror 2320. The focus actuator also may steer the beam to compensate for errors in the pyramid facets or caused by vibrations. This implementation illustrates use of four arms with one workpiece and one SLM. Features of this implementation can be combined with other implementations that use multiple writing or reading devices and multiple workpieces.

It is contemplated that multiple writing or detecting devices can be used along the same arm and path. In addition, multiple writing or detecting devices can be positioned around the axis of rotation to write to multiple workpieces or to a large workpiece.

Likewise the technology disclosed enables many instruments to be used on large flat substrates and scanning at high speed, e.g. on solar panels, display substrates, sheet metal, architectural glass, roll-to-roll plastic, paper, and the like. Through the rotating arms an image may be captured at the periphery and transferred to the hub where a camera or an optical analytical instrument may be situated, e.g. a reflectometer, spectrophotometer, scatterometer, multispectral camera, polarimeter, fluorescence or photo-luminescence instrument. Instruments that are complex, bulky or fragile can be mounted fixed at the hub and still access any point on the surface of, say, a two meter wide thin-film photovoltaic panel passing on a conveyor under the rotor, thereby enabling full-area inspection or analysis at dense grids on large workpieces without removing sheets for analysis or stopping the roll-to-roll flow. The rotor may have only flat optics or it may have reflecting relays in the arms, allowing achromatic use from far IR to deep UV. The illumination, e.g. UV for fluorescence studies, may be brought from the hub or it may be generated within the rotor.

FIG. 24 shows another embodiment of the technology disclosed with possible image generators $IG_{1-8}$ and an example image detector ID. The image generator is positioned on a fixed frame and the mirrors $M_1$ and $M_2$ mounted on the rotor R send the image to the periphery of the rotor where it scans over the workpiece WP. The lenses $L_1$ and $L_2$ form a relay which makes a sharp image of the image I created by the image generator IG. The rotor drive RD makes the rotor spin and the angle is measured by the position detector $PD_1$. The position of the stage is measured by a second position detector $PD_2$. The controller C controls the image generator, so that the pattern P is formed correctly on the workpiece.

The image generator can be of many types as shown by the examples $IG_{1-8}$: $IG_1$ is a narrow one-dimensional array of light modulators, e.g. a grating light valve. $IG_2$ is a broad array of modulators which forms a narrow line on the workpiece by anamorphic optics. That is, the ratio between the illuminated area on the modulator and on the workpiece is different in x and y. The aspect ratio (length over width) of the modulator is at least two times smaller than the same ratio in the image, preferably five times smaller, and often will be ten times smaller. $IG_3$ is a two-dimensional array of modulators, such as a micromechanical modulator array or a 2D array of LCD shutters. $IG_4$ is a spot grid array, e.g. formed by a lens array where each lens forms a focus spot and the light in focus spots are individually modulated. e.g. by an LCD shutter or a DMD chip (Texas Instruments' DLP technology). The array of spots can also be formed by an array of sources, e.g. VCSEL lasers. In $IG_5$ an irregular array of focus spots is created, e.g. by a computer-controlled hologram or an SLM. The irregular array can for example be used to drill vias in wafers, PCBs and other substrates. $IG_6$ has a scanning beam as image generator, e.g. a single-mode laser beam modulated by an acoustooptic or electrooptic modulator and scanned by an acoustooptic, electrooptic, or mechanical scanner. $IG_7$ has multiple beams being modulated simultaneously and scanned in parallel. If the pattern is repeated or stereotype, e.g. a line pattern parallel to the workpiece it may be sufficient to use a mask or stencil as image generator as shown in $IG_8$. Finally, the optics can be reversed and the image generator replaced with an image detector, ID shown here symbolically as a camera. The illumination source may have properties adapted to each of the cases above: $IG_{1-2}$, $IG_{4-7}$ may use a continuous light sources or a light source with a high frequency of short pulses, while $IG_{3-5}$ and $IG_8$ may be used with pulsed light. The camera ID representing image detectors, spectrophotometers, time-resolved photometers, scatterometers, etc. may be used with continuous or pulsed light depending on the exact need.

As mentioned above, the disclosed technology enables many instruments to be used on large flat substrates and scanning at high speed, e.g. on solar panels, display substrates, sheet metal, architectural glass, roll-to-roll plastic, paper, and the like. Through the rotating arms an image may be captured at the periphery and transferred to the hub where a camera or detector (e.g., a vidicon, CCD, CID, CMOS device, and/or a TDI, intensified, gated, avalanche, single photon, photon-counting, interferometric, colorimetric, heterdyne, photoconductive or bolometric detector or array) is located, or an optical analytical instrument may be situated, (e.g., a reflectometer, spectrophotometer, colorimeter, scatterometer, multispectral camera, polarimeter, or a fluorescence, photo-luminescence or photoacoustic instrument).

Other possible uses are for optical measurements of heat (infrared emission), color, flatness, smoothness, film thickness, chemical composition, cleanliness, or for verification of pattern integrity or fidelity. The method is particularly beneficial where an image of the surface or an exact location of a found defect or feature is needed. Instruments that are complex, bulky or fragile can be mounted fixed at the hub and still access any point on the surface of, say, a two meter wide thin-film photovoltaic panel passing on a conveyor under the rotor, thereby enabling full-area inspection or analysis at dense grids on large workpieces without removing sheets for analysis or stopping the roll-to-roll flow. The rotor may have only flat optics or it may have reflecting relays in the arms, allowing achromatic use from far IR to deep UV. The illumination (e.g. visible incident light for reflected-light microscopy) may be brought from the hub or it may be generated within the rotor. Several instruments and or writing modes may be combined in one rotor, either by being combined in one optical arm or by employing different ones. At least one instrument or optical image device may emit an exciting beam through an arm and receives an image back from the workpiece, e.g. UV for fluorescence studies. The rotation may be continuous with a constant or varying angular speed or alternatively be driven by in a stop and go fashion, in particular for random-access analysis of workpieces. Focusing of the imaging optics may be fixed, variable from time to time or dynamic during scanning and based on feedback from focus sensors based on interferometry, back-reflection, proximity to a fiber end, optical triangulation, optical defocus or parallax; fluid flow, pressure or viscous resistance; ultrasound time-of-flight or phase; capacitance, inductance or other suitable phenomena indicating a distance or position.

Some Particular Embodiments

The disclosed technology may be practiced as a method or device adapted to practice the method. The disclosed technology may be an article of manufacture such as media impressed with program instructions to carry out the computer-assisted method or program instructions that can be combined with hardware to produce a computer-assisted device.

In this section, we will describe methods and devices both in terms of a path that may convey image information in either direction and in terms of an image device that may be a transmitter or receiver of image information to or from a workpiece. One of the disclosed methods is a method of scanning a workpiece 1111. This method can apply either to writing to or reading from the workpiece. The method involves using at least one optical arm 1140A-C rotating about a hub 1148 to relay information between an optical image device 330, 1130 and a workpiece 310, 1111. The optical image device may be a writing device, such as an SLM or DMD, or a reading device, such as a CMOS detector array. It may be 2D or 1D and swept. The workpiece is positioned to be generally perpendicular to an axis of rotation of the optical arm. The relayed image information maintains a substantially constant azimuthal orientation between the image device and the workpiece. In this method, the relay follows a path that extends from the workpiece 310, 1111, all along the optical arm 1140A-C, over a hub 1148 and to the image device 1130. The relayed image information may be conveyed either direction along this path. The azimuthal orientation of the relayed information is defined to be substantially constant between the image device 330 and the workpiece 310 when a set image at the optical image device 330, 630 maintains a constant angular relationship to a relayed version 345A-B, 645A-B of the set image on the workpiece 310. The angular relationship is considered substantially constant when it varies by no more than one half of the degree in rotation as the optical arm sweeps through 5° of rotation 347. In some implementations, the angular relationship will vary by no more than one half of the degree in rotation as the optical arm sweeps through 45° of rotation 347. An upright "R" on the workpiece should be upright regardless of whether the optical arm 240A-B is at 10 o'clock, noon or two o'clock in its rotational sweep 347.

In one implementation, the optical image device 330, 1130 used in this method forms an image that is relayed to the workpiece 310, 1111. That is, it writes to the workpiece. This relayed image information may be conveyed in a pulsed series of stamps. Or, it may be conveyed as a swept array of writing beams.

In another implementation, the optical image device 330, 1130 used in this method detects an image that is relayed from the workpiece 310, 1111. That is, it reads the workpiece.

This method further may include reading from or writing to the workpiece and assembling composite image information 545A-D corresponding to an image at the workpiece spanning some part of the optical arm's sweep. For instance, the composite image information may correspond to at least five, ten or twenty degrees of sweep. The composite image information may be information read from the workpiece or it may be a map of information to be written to the workpiece or to be resampled and written to the workpiece.

Of course, the embodiments, implementations, aspects and features of the first method above can be combined in numerous ways to produce a variety of systems.

A second method embodiment is a method of writing to or reading from a workpiece 1010. A stationary optical image device is used to form or collect relayed image 1050 information (FIGS. 4, 10 and 11). The method involves using at least one rotating arm 1140A-C that relays 1424 information between an optical image device 330, 1130 and a workpiece 310, 1111. The optical image device may be a writing device, such as an SLM or DMD, or a reading device, such as a CMOS detector array. It may be 2D or 1D and swept. A curved stripe is repeatedly swept across the surface of the workpiece to write or read a contiguous image 430 formed from overlapping images that are stitched together. Optimally, maintaining the azimuthal orientation of the image 430, 445 during the sweep of the printing arm simply for creating a contiguous pixel map representing the surface of the workpiece, either before writing to or upon reading from the workpiece.

The angular relationship is considered substantially constant when it varies by no more than one half of the degree in rotation as the optical arm sweeps through 5° of rotation 347. In some implementations, the angular relationship will vary by no more than one half of the degree in rotation as the optical arm sweeps through 45° of rotation 347. An upright "R" on the workpiece should be upright regardless of whether the optical arm 240A-B is at 10 o'clock, noon or two o'clock in its rotational sweep 347.

In yet another implementation, the relaying of image 430 information includes traversing a first optical axis coupled to the stationary optical image device and positioned at or near an axis of rotation 1310 of the rotating arm 1724. A second optical axis is traversed, which has been attached to the surface 1722 and positioned distally along the rotating arm from the axis of rotation. The first and second optical axes are substantially parallel or anti-parallel 859 to each other within about eight degrees 1412.

In another implementation, the second optical axis can be at least ten times as far from the axis of rotation 1310 as the first optical axis.

In another implementation, the optical parity (FIGS. 16*a-c*) of the relayed image 1050 information is preserved when the first and second optical axes 857 are substantially parallel and reversed when they are substantially anti-parallel 859.

In a first device embodiment, an optical scanning device is described. This device may be either a writing or reading device 1030. The device involves using at least one optical arm 1140A-C rotating about a hub 1148 having an axis of rotation. The device has a hub, which may include on-axis (FIG. 10) or off-axis (FIGS. 11-15) relay of information between an optical image device 330, 1130 and a workpiece 310, 1111. The workpiece is positioned to be generally perpendicular to an axis of rotation of the optical arm on a stage that is part of the device. The device includes an image device 330, 1130. The relay optics relay optical information between the image device 330, 1130 and the workpiece 310, 1111 while maintaining a substantially constant azimuthal orientation between images at the image device 330, 630 and the relayed version 345A-B, 645A-B. In this device, the relay follows a path that extends from the workpiece 310, 1111, along the optical arm 1140A-C, over a hub 1148 and to the image device 1130. The relayed image 1050 information may be conveyed either direction along this path 1312. An image processor 1135 assembles a contiguous image 430 corresponding to the relayed image 1050 information using a rotating arm 1724 sweeping over parts of the surface 1722. When the device is a writing device, the image processor 1135 writes parts of the contiguous image onto the surface to form a contiguous curved stripe. When the device is a reading device, the image processor reads parts of the contiguous image from a contiguous curved stripe on the surface and stitches the parts together in memory to form the contiguous image. The azimuthal orientation of the relayed information is defined to be substantially constant when it varies by no more than one half of the degree in rotation as the optical arm sweeps through 5° of rotation 347. In some implementations, the angular relationship will vary by no more than one half of the degree in rotation as the optical arm 1140A sweeps through 45° of rotation 347. An upright "R" on the workpiece 1010 should be upright regardless of whether the optical arm 1140A is at 10 o'clock, noon or two o'clock in its rotational sweep 347.

In one implementation, the device can also include a first optical axis of the relay optics 2222 attached to the stationary optical image device and positioned at or near an axis of rotation 1310 of the rotating arm 1724. The second optical axis of the relay optics 2222 is attached to the surface 1722 and positioned distally along the rotating arm 1724 from the axis of rotation 1310.

In another implementation, the second optical axis can be at least ten times as far from the axis of rotation 1310 as the first optical axis.

In another implementation, the optical parity of the relayed image 1050 information is preserved when the first and second optical axes 857 are substantially parallel and reversed when they are substantially anti-parallel 859.

In yet another implementation, the optical image device forms an image 430 that is relayed 1132 to the workpiece 1010.

In alternate embodiments, the part of the path 1312 near the axis of rotation 1310 for the arm 1724 may be on-axis (FIG. 10) or off-axis (FIGS. 11-15.) These embodiments can be combined in any variety with the implementations above and other features described below. In some embodiments (FIGS. 8*a-c*, 10, 16*a-c*), a first part of the path near the hub coincides with the axis of rotation 857, 859. In these so-called on-axis embodiments, a second part of the path touching the workpiece may run either parallel 857 or anti-parallel 859 to the part of the path that is coincident with the axis of rotation. For on-axis embodiments, a wide variety of mirror arrangements can be used. For instance, a mirror or prism 854, FIG. 16 M1 can be positioned above the rotating arm assembly and can relay information directly onto the rotating arm. Or, a mirror or prism 1042 can be positioned below the rotating arm assembly 1040 and use overhead mirrors 1043, 1045 in a so-called Offner projection system. The Offner projection system brings the relayed image 1050 back towards the workpiece 1010, either directly or with redirection along a rotating optical arm. In some implementations, a large stationary overhead mirror 1043 can be replaced with small sections of mirrors that rotate 1044 with the arm(s) to maintain the proper position in the optical path. Other on-axis mirror arrangements could be devised; this list is not intended to be exhaustive.

So-called off-axis embodiments (FIGS. 11-15) have a part of the path 1312, 1412 that is near the hub, which does not coincide with the axis of rotation 1310, 1410. In these embodiments, a first part of the path 1312 near the axis of rotation 1310 is parallel to the axis of rotation or at least within eight degrees 1412 of parallel to the axis of rotation 1410. A second part of the path 1330 that touches the workpiece is within eight degrees of parallel to the axis of rotation. Alternatively, the first and second parts of the path may be within eight degrees of parallel to one another.

This method further may include reading from or writing to the workpiece and assembling composite image information 545A-D corresponding to an image at the workpiece spanning some part of the optical arm's sweep. For instance, the composite image information may correspond to at least five, ten or twenty degrees of sweep. The composite image information may be information read from the workpiece or it may be a map of information to be written to the workpiece or to be resampled and written to the workpiece.

Of course, the embodiments, implementations, aspects and features of the first method above can be combined in numerous ways to produce a variety of systems.

A second device embodiment relays optical information onto or from a workpiece. This device may be either a writing or reading device. The device involves using at least one optical arm 1140A-C rotating about a hub 1148 having an axis of rotation. The device has a hub, which may include on-axis (FIG. 10) or off-axis (FIGS. 11-15) relay of information between an optical image device 330, 1130 and a workpiece 310, 1111. The workpiece is positioned to be generally perpendicular to an axis of rotation of the optical arm on a stage that is part of the device. The device includes an image device 330, 1130. The relay optics relay optical information between the image device 330, 1130 and the workpiece 310, 1111 while maintaining a substantially constant azimuthal orientation between images at the image device 330, 630 and the relayed version 345A-B, 645A-B. In this device, the relay follows a path that extends from the workpiece 310, 1111, along the optical arm 1140A-C, over a hub 1148 and to the image device 1130. The relayed image information may be conveyed either direction along this path. The azimuthal orientation of the relayed information is defined to be substantially constant when it varies by no more than one half of the degree in rotation as the optical arm sweeps through 5° of rotation 347. In some implementations, the angular relationship will vary by no more than one half of the degree in rotation as the optical arm sweeps through 45° of rotation 347. An upright "R" on the workpiece should be upright regardless of whether the optical arm is at 10 o'clock, noon or two o'clock in its rotational sweep.

In one implementation, the optical image device 330, 1130 forms an image that is relayed to the workpiece 310, 1111. That is, it writes to the workpiece. This relayed image information may be conveyed in a pulsed series of stamps. Or, it may be conveyed as a swept array of writing beams.

In another implementation, the optical image device 330, 1130 detects an image that is relayed from the workpiece 310, 1111. That is, it reads the workpiece.

In alternate embodiments, the part of the path near the axis of rotation for the arm may be on-axis (FIG. 10) or off-axis (FIGS. 11-15.) These embodiments can be combined in any variety with the implementations above and other features described below. In some embodiments (FIGS. 8a-c, 10, 16a-c), a first part of the path near the hub coincides with the axis of rotation 857, 859. In these so-called on-axis embodiments, a second part of the path touching the workpiece may run either parallel 859 or anti-parallel 859 to the part of the path that is coincident with the axis of rotation. For on-axis embodiments, a wide variety of mirror arrangements can be used. For instance, a mirror or prism 854, FIG. 16 M1 can be positioned above the rotating arm assembly and can relay information directly onto the rotating arm. Or, a mirror or prism 1042 can be positioned below the rotating arm assembly 1040 and use overhead mirrors 1043, 1045 in a so-called Offner projection system. The Offner projection system brings the relayed image 1050 back towards the workpiece 1010, either directly or with redirection along a optical arm. In some implementations, a large stationary overhead mirror 1043 can be replaced with small sections of mirrors 1044 that rotate with the arm(s) to maintain the proper position in the optical path. Other on-axis mirror arrangements could be devised; this list is not intended to be exhaustive.

So-called off-axis embodiments (FIGS. 11-15) have a part of the path 1312 that is near the hub, which does not coincide with the axis of rotation 1310, 1410. In these embodiments, a first part of the path 1312 near the axis of rotation 1310 is parallel to the axis of rotation 1310 or at least within eight degrees of parallel to the rotation. A second part of the path 1330 that touches the workpiece is within eight degrees 1412 of parallel to the axis of rotation. Alternatively, the first and second parts of the path may be within eight degrees of parallel to one another.

This device further may include an image processor 1135 that controls reads from or writes to the workpiece and an image processor that assembles composite image information 545A-D corresponding to an image at the workpiece spanning some part of the optical arm's sweep. For instance, the image processor may assemble composite image information that corresponds to at least five, ten or twenty degrees of sweep. The composite image information may be information read from the workpiece or it may be a map of information to be written to the workpiece or to be resampled and written to the workpiece.

Of course, the embodiments, implementations, aspects and features of the first device above can be combined in numerous ways to produce a variety of systems. By this statement, we mean to disclose combinations as if they were multiply dependent claims, each feature depending from all of the preceding features, except where they might be logically inconsistent.

A further embodiment provides a low-cost, high throughput optical processing device using one or more optical arms rotating about a hub to relay image information between a hub and the surface of the workpiece, while maintaining a consistent orientation relationship between information on the workpiece and information at the hub of the optical arm, even as the arm sweeps an arc across the workpiece 410. Individual optical arms can have simple optics and be light weight. Multiple arms can be used to increase the duty cycle of relaying information as a percentage of a sweep through a full circle. The features, aspects, etc. described above may be combined in many configurations with this further embodiment.

Another embodiment provides a high throughput, low data complexity system using one or more optical arms rotating about a hub to relay image information between a hub and the surface of the workpiece 410, while maintaining a consistent orientation relationship 430, 445A-B between information on the workpiece and information at the hub of the optical arm, even as the arm sweeps an arc across the workpiece. Images separated in time can be represented as displaced from one another by a displacement vector, without rotation of the images. Motion of a workpiece relative to an axis of rotation for the optical arms can also be expressed as a displacement vector. The two displacement vectors can be summed. The rotational speed of the optical arms and relative movement of the workpiece can be selected to produce a desired relationship that impacts overlap between images. The features, aspects, etc. described above may be combined in many configurations with this other embodiment.

The preceding description has carefully referred to relaying images between the workpiece and hub because image information can be relayed in either direction. For writing to a workpiece, an SLM, DMD, scanning laser(s) or other radiation source can be controlled at the hub and the rotating arm used to project the image onto the workpiece. For inspecting or imaging a workpiece, a detector at the hub can be used to capture an image scanned from the workpiece under an optical component at the distal end of the arm(s).

Another embodiment comprises a method for scanning a large flat workpiece to read or write an image 855 on it using a stationary image device 430 having an optical axis (FIGS. 14a-14b). The image 855 can be either prepared or selected. Scan optics, having an entrance near the image device optical axis and an exit optical axis near the workpiece, are provided. Optical axes can be, essentially, parallel or anti-parallel and aligned with the stationary device having the entrance optical axis. The present disclosure consists of drawn examples depicting 8 degrees difference.

The scan optics are rotated around a rotation axis perpendicular to the workpiece and geometrically close to the entrance optical axis i.e., closer or much closer than the exit optical axis. A controller is used for controlling rotation by scan optics. Partial images can be read or written for different rotation angles. Also, a combined image can be built in the controlling electronics before or after the photons fly.

In one implementation, the image 445 is translated but not rotated while the scan optics rotate. Alternatively, the images can rotate and a combined image 545A-D built from partial images rotated relative to each other.

In another implementation, entry and exit images may have the same parity. The x and y axes can be scaled and rotated but cannot be reversed. They must be visible from the same side along the light beam if the optical axes are parallel, or along one axis and against the other if they are anti-parallel.

Stationary device may include a laser diode array, a LED array, a 2D SLM 1130. A 2D SLM might be a tilting mirror, piston mirror, or DMD device, or an LCD shutter device. A 1D SLM might be a GLV. A scanner could be used, such as an acoustooptic, polygon or, electrooptic scanner. A line camera, an area camera, a spectrometer, scatterometer or an interferometer could be used in a system that read from the workpiece instead of writing to it. Scan optics may include mirrors and lenses.

One embodiment of the disclosed technology uses a rotating or swinging arm that describes an arc across a workpiece as it scans, instead of following a traditional straight-line motion. One aspect of the technology is that the arm can be placed radially in a rotating disk or rotor and that the rotor can have several arms, e.g. 2, 3, 4, 6, or 8 arms, thereby multiplying the scanned surface area per time unit.

Another aspect of the technology is that heavy, complex, fragile machine parts, or parts that are expensive or need many connections and services can be placed stationary near the center or hub of the rotor and be shared by the multiple arms.

A further aspect of the technology is that an image is relayed between an image device placed stationary near the hub of the rotor and the workpiece through the radial arm and that the relayed image is non-rotating, or essentially non-rotating, when the rotor rotates.

It is another aspect of the technology that partial images are created when the rotor rotates and that the partial images are stitched together to a continuous curved stripe. Yet another aspect of the disclosed technology is that the stitching together of partial images is done with bitmaps which are essentially non-rotating, but where the pixel grid is displaced from image to image.

While the disclosed technology is disclosed by reference to the preferred embodiments and examples detailed above, it is understood that these examples are intended in an illustrative rather than in a limiting sense. Computer-assisted processing is implicated in the described embodiments, implementations and features. Accordingly, the disclosed technology may be embodied in methods for reading or writing a workpiece using at least one optical arm that sweeps an arc over the workpiece, systems including logic and resources to carry out reading or writing a workpiece using at least one optical arm that sweeps an arc over the workpiece, systems that take advantage of computer-assisted control for reading or writing a workpiece using at least one optical arm that sweeps an arc over the workpiece, media impressed with logic to carry out, data streams impressed with logic to carry out reading or writing a workpiece using at least one optical arm that sweeps an arc over the workpiece, or computer-accessible services that carry out computer-assisted reading or writing a workpiece using at least one optical arm that sweeps an arc over the workpiece. It is contemplated that modifications and combinations will readily occur to those skilled in the art, which modifications and combinations will be within the spirit of the disclosed technology and the scope of the following claims.

We claim as follows:

1. A method of writing to a workpiece, the method including:
   using a stationary optical image device to form relayed image information;
   relaying the image information along optics of at least one rotating arm between the stationary optical image device and a surface of the workpiece;
   repeatedly sweeping a curved stripe across the surface of the workpiece to write a contiguous image formed from overlapping partial images that are stitched together;
   determining a grid of each overlapping partial image; and
   converting coordinates of bitmaps representing partial images between a common reference grid and the grid of the overlapping partial image by using computational operations to compensate for displacement of image fields in order to provide for the stitching of the partial images.

2. The method of claim 1, wherein the partial images are overlapping and the grid of each partial image is converted between its own grid and a common reference grid by image processing to provide the stitching of the partial images.

3. The method of claim 1, further including relaying pattern information between the optical image device and the surface with a substantially constant azimuthal orientation, wherein the azimuthal orientation of the relayed image information is substantially constant when a set image at the optical image device maintains a constant angular relationship to relayed versions of the set image on the workpiece with no more than a 0.5 degree rotational variation in the angular relationship when the relayed versions are separated by 5 degrees sweep of the rotating arm.

4. The method of claim 1, further including relaying pattern information between the optical image device and the surface with a substantially constant azimuthal orientation, wherein the azimuthal orientation of the relayed image information is substantially constant when a set image at the optical image device maintains a constant angular relationship to relayed versions of the set image on the workpiece with no more than a 0.5 degree rotational variation in the angular relationship when the relayed versions are separated by 45 degrees sweep of the rotating arm.

5. The method of claim 1, wherein the relaying the image information further includes:
   traversing a first optical axis coupled to the stationary optical image device and positioned at or near an axis of rotation of the rotating arm; and
   traversing a second optical axis coupled to the surface and positioned distally along the rotating arm from the axis of rotation.

6. The method of claim 5, wherein the first and second optical axes are substantially parallel or anti-parallel to each other within about eight degrees.

7. The method of claim 5, wherein the second optical axis is at least ten times as far from the axis of rotation as the first optical axis.

8. The method of claim 5, further including preserving optical parity of the relayed image information when the first and second optical axes are substantially parallel.

9. The method of claim 5, further including reversing optical parity of the relayed image information when the first and second optical axes are substantially anti-parallel.

10. The method of claim 1, wherein the optical image device forms an image that is relayed to the workpiece.

11. The method of claim 1, wherein the optical image device that forms the image is a spatial light modulator, abbreviated SLM.

12. The method of claim 1, wherein the optical image device that forms the image is an array of writing beams.

13. The method of claim 1, wherein the relayed image information is relayed in a pulsed series of stamps.

14. The method of claim 1, wherein the relayed image information is relayed in a substantially continuous sweep.

15. A system comprising an optical scanning device that writes to a workpiece, including:
   at least one optical arm rotating about a hub and having an axis of rotation;
   a stage on which the workpiece is positioned, which is perpendicular to the axis of rotation;
   a stationary optical image device;
   relay optics that relay image information along the optical arm, between the stationary optical image device and a surface of the workpiece; and
   an image processor configured to assemble a contiguous image formed from partial images corresponding to the image information relayed as the optical arm sweeps over parts of the surface;
   the image processor further configured to determine a grid of each partial image and to convert coordinates of a bitmap representing the partial image between a common reference grid and the grid of the partial image by using computational operations in order to compensate for displacement of image fields to provide for stitching of partial images.

16. The system of claim 15, wherein the relay optics relay pattern information between the optical image device and the surface with a substantially constant azimuthal orientation, wherein the azimuthal orientation of the relayed image information is substantially constant when a set image at the optical image device maintains a constant angular relationship to relayed versions of the set image on the workpiece with no more than a 0.5 degree rotational variation in the angular relationship when the relayed versions are separated by 5 degrees sweep of the optical arm.

17. The system of claim 15, wherein the relay optics relay pattern information between the optical image device and the surface with a substantially constant azimuthal orientation, wherein the azimuthal orientation of the relayed image information is substantially constant when a set image at the optical image device maintains a constant angular relationship to relayed versions of the set image on the workpiece with no more than a 0.5 degree rotational variation in the angular relationship when the relayed versions are separated by 45 degrees sweep of the optical arm.

18. The system of claim 15, further including:
   a first optical axis of the relay optics, coupled to the stationary optical image device and positioned at or near an axis of rotation of the optical arm; and
   a second optical axis of the relay optics, coupled to the surface and positioned distally along the optical arm from the axis of rotation.

19. The system of claim 18, wherein the first and second optical axes are substantially parallel or anti-parallel to each other within about eight degrees.

20. The system of claim 18, wherein the second optical axis is at least ten times as far from the axis of rotation as the first optical axis.

21. The system of claim 18, wherein the relay optics preserve optical parity of the relayed image information when the first and second optical axes are substantially parallel.

22. The system of claim 18, wherein the relay optics reverse optical parity of the relayed image information when the first and second optical axes are substantially anti-parallel.

23. The device of claim 18, wherein the optical image device that forms the image is any one of a spatial light modulator, abbreviated SLM, grating light valve, abbreviated GLV, digital micromirror device, abbreviated DMD or liquid crystal display, abbreviated LCD.

24. The system of claim 18, wherein the optical image device that forms the image is any one of a laser diode array or an LED array.

25. The system of claim 18, wherein the optical image device that forms the image is an array of writing beams.

26. The system of claim 15, wherein the relayed image information is relayed in a pulsed series of stamps.

27. The system of claim 15, wherein the relayed image information is relayed in a substantially continuous sweep.

* * * * *